United States Patent
Miya et al.

(10) Patent No.: US 7,622,198 B2
(45) Date of Patent: Nov. 24, 2009

(54) DECORATIVE ARTICLE HAVING WHITE COATING AND METHOD FOR MANUFACTURE THEREOF

(75) Inventors: Yukio Miya, Nishitokyo (JP); Koichi Naoi, Nishitokyo (JP); Fumio Tase, Nishitokyo (JP); Yukio Tanokura, Nishitokyo (JP)

(73) Assignee: Citizen Holdings Co., Ltd., Tokyo (JP)

( * ) Notice: Subject to any disclaimer, the term of this patent is extended or adjusted under 35 U.S.C. 154(b) by 210 days.

(21) Appl. No.: 10/469,394

(22) PCT Filed: Dec. 26, 2002

(86) PCT No.: PCT/JP02/13661

§ 371 (c)(1),
(2), (4) Date: Aug. 28, 2003

(87) PCT Pub. No.: WO03/056966

PCT Pub. Date: Jul. 17, 2003

(65) Prior Publication Data

US 2004/0093730 A1 May 20, 2004

(30) Foreign Application Priority Data

Dec. 28, 2001 (JP) .............................. 2001-400629
Jan. 9, 2002 (JP) .............................. 2002-001953
May 23, 2002 (JP) .............................. 2002-148793

(51) Int. Cl.
*B32B 15/01* (2006.01)
*B32B 7/02* (2006.01)
*C25D 5/10* (2006.01)

(52) U.S. Cl. ..................... 428/670; 428/672; 428/673; 428/687; 428/660; 428/213; 428/214; 428/215; 428/336; 428/542.2

(58) Field of Classification Search ............. 428/670, 428/672, 673, 687, 660, 213, 214, 215, 220, 428/336, 542.2, 698, 627; 63/34; 427/404, 427/405, 419.1, 250, 255.11
See application file for complete search history.

(56) References Cited

U.S. PATENT DOCUMENTS

| | | | | |
|---|---|---|---|---|
| 4,403,014 A | * | 9/1983 | Bergmann | 428/546 |
| 4,517,217 A | | 5/1985 | Hoffman | |
| 4,656,145 A | * | 4/1987 | Soroi | 501/86 |
| 5,972,526 A | * | 10/1999 | Matsumoto et al. | 428/644 |
| 5,985,469 A | | 11/1999 | Kurakata et al. | |
| 2003/0059634 A1 | | 3/2003 | Naoi et al. | |

FOREIGN PATENT DOCUMENTS

| | | | |
|---|---|---|---|
| EP | 0 686 706 A | | 12/1995 |
| JP | 60-137882 A | | 7/1985 |
| JP | 63-053267 A | | 3/1988 |
| JP | 03-120355 A | | 5/1991 |
| JP | 10937 A | | 8/1993 |
| JP | 06-272019 | * | 9/1994 |
| JP | 6-272019 A | | 9/1994 |
| JP | 8-013133 A | | 1/1996 |
| JP | 10-298782 A | | 11/1998 |
| JP | 2001-234392 A | | 8/2001 |
| JP | 2001-295074 A | | 10/2001 |
| JP | 2001-305244 A | | 10/2001 |
| JP | 2001-355094 A | | 12/2001 |
| JP | 333236 A | | 5/2003 |
| WO | WO 95/18248 A | | 12/1995 |
| WO | WO 02/00958 A | | 1/2002 |

* cited by examiner

*Primary Examiner*—Timothy M Speer
*Assistant Examiner*—Gordon R Baldwin
(74) *Attorney, Agent, or Firm*—The Webb Law Firm

(57) ABSTRACT

The present invention provides personal ornaments having as an outermost layer a white ornamental coating film having platinum or a platinum alloy formed by dry-plating, including: an ornament base article made of a metal or ceramic, an underlayer formed on the surface on the base article, an abrasion resistant layer formed on the surface of the underlayer by dry-plating, and an ornamental coating layer having platinum or platinum alloy formed on the surface of the abrasion resistant layer by dry-plating. Also, the present invention provides personal ornaments having a coloring layer including an abrasion-resistant layer, a mixture layer and an outermost layer, the outermost layer being a white hard coating film having a noble metal or a noble metal alloy formed by dry-plating on the surface of the mixture layer.

25 Claims, No Drawings

DECORATIVE ARTICLE HAVING WHITE COATING AND METHOD FOR MANUFACTURE THEREOF

BACKGROUND OF THE INVENTION

1. Field of the Invention

The present invention relates to a personal ornament (accessories) having a white coating film, and a process for producing the personal ornament. More specifically, the present invention relates to a personal ornament having a hard white stainless-steel-colored coating film, and a process for producing the personal ornament; and relates also to a personal ornament having a hard white platinum-colored or platinum-alloy-colored coating film, and a process for producing the personal ornament. (Hereinafter the "personal ornament" is simply referred to as an "ornament".)

2. Description of Related Art

Heretofore, many ornaments such as watches, necklaces, pendants, and brooches are made from a copper alloy owing to workability, material cost, and other reasons.

However, a personal ornament made from a copper alloy, which is less corrosion-resistant as the base material, is usually covered with a plating film formed by wet plating to protect the base material from corrosion. This plating film is usually constituted of an underlying nickel plating film formed by wet plating and an outermost plating film formed thereon by wet plating. For coloring the outermost layer golden, a gold plating film is formed on the nickel plating film surface by wet plating. For coloring the outermost layer white, a palladium plating film, a palladium alloy plating film, or a rhodium plating film is formed on the nickel plating film by wet plating. The plating film is generally formed in a thickness in the range of 1-5 μm.

The aforementioned ornaments, however, have the disadvantage of high cost owing to the noble metal-containing outermost plating film for corrosion resistance. Therefore, low-priced personal ornaments naturally have a thin outermost plating film, lacking in long-term corrosion resistance. Moreover, in the production of the low-priced ornaments, the noble metal plating bath should be strictly controlled and maintained in order to obtain steadily a thin outermost plating film, and the workers for the plating operation should have high skill in order to obtain steadily the outermost plating film of the desired color tone. Furthermore, an inexpensive personal ornament having a characteristic white color of the stainless steel, or an inexpensive personal ornament having a characteristic beautiful white color of a platinum or platinum alloy has not yet been produced at a low cost.

Therefore, the inventors of the present invention disclosed, in JP-A-3-120355 (The term "JP-A" herein means "an unexamined Japanese Patent Publication"), a white ornament comprising a base material coated on the surface with a white hard film and further coated thereon with a platinum or platinum alloy coating film. However, the ornament does not have the characteristic white color demanded in the market although it gives high-quality image. An ornament having a white coating and a process for producing the ornament are disclosed in the specification in international laid-open publication of WO-02/00958 of international patent application (PCT/JP01/05130) based on priority by Japanese Patent Application No. 2000-192077 (filed on Jun. 27, 2000), not a prior art. This ornament is constituted of a less corrosion-resistant low-quality metal (including an alloy) as the base and having its surface covered with a white-colored stainless steel coating film for long-term corrosion-resistance, and is low-priced.

The disclosed ornament has a metal base article which is covered with a white-colored stainless-steel film formed by dry plating. The ornament, which is constituted of a low-quality base metal like a copper alloy, is coated with a wet-plated nickel film or a dry-plated film of titanium carbide, zirconium carbide, or the like as an underlying layer and further coated with a stainless steel film as the surface layer.

However, such an ornament, which has an outermost layer coated only with a white stainless-steel film without a noble metal surface coating, is lacking in massiveness image and high-quality image of the surface. Moreover, this white coating film has a disadvantage of low hardness and low scratch resistance due to the base material or underlying plating film, tending to deteriorate in the external appearance quality in a short period. Furthermore, in a case where a nickel plating film or nickel-alloy plating film is formed as the underlying plating film depending on the kind of the base material, nickel allergy can be produced to cause skin rash or eczema with individual difference.

Accordingly, an ornament is demanded which has high-quality image like stainless steel coating film, not deteriorating readily in the external appearance by scratching or other causes, and does not cause metal allergy. The process for producing such an ornament is also demanded.

In the aforementioned JP-A-3-120355, a TiN coating film is formed as the white hard film in the Example. The coating film is dark grey or light gold in color. Therefore, a platinum coating film or a platinum alloy coating film formed on the TiN coating film is affected by the color tone of the white hard coating film (TiN coating film), not developing a characteristic beautiful color of platinum or a platinum alloy. Further, in the case where the TiN coating film is thin, an impact or a pressure from the outside can dent the base metal, denting also the platinum or platinum-alloy coating film to form a defect, disadvantageously. The article in the above Example has a platinum coating film of 0.1 μm thick, which is disadvantageous in cost. Furthermore, if the formation of the platinum or platinum alloy coating film is not successful, the platinum or platinum alloy coating film is removed and newly formed again. This film removal is conducted by use of aqua regia. The aqua regia will corrode not only the white hard TiN coating film but also the metal base surface, which makes impossible the film reformation, disadvantageously.

Therefore, an ornament is demanded which has a characteristic color of platinum or a platinum alloy coating film, and superior quality, not deteriorating readily in the external appearance by denting, scratching or other causes, and having a white coating film of high quality with a lower cost. Also a process for producing the ornament is also demanded which enables removal of the platinum or platinum alloy coating film without corrosion of the ornament base, the underlying layer or the titanium carbide layer, and enables regeneration of the ornament by reforming the platinum or platinum alloy coating layer.

The present invention solves the above problems by providing a personal ornament which gives superior quality, does not readily deteriorate in the external appearance by scratching or other causes, and has a white coating film having high-quality image like a stainless steel film, especially does not cause metal allergy, and also provides a process for producing such an ornament.

Further, the present invention provides a personal ornament which gives a characteristic color of platinum or a platinum alloy, superior quality, does not readily deteriorate in the external appearance by scratching or other causes, has a white coating film of high quality at a lower cost, and provides a process for producing the ornament. Still further, the present invention provides a personal ornament which enables removal of the defective platinum or platinum alloy coating film without corrosion of the ornament article base, the underlayer or the titanium carbide layer to regenerate the ornament by reforming the platinum or platinum alloy coating film, and provides a process for producing the same.

SUMMARY OF THE INVENTION

The first personal ornament of the present invention has as an outermost layer a white coating film composed of a noble metal or a noble metal alloy formed by dry-plating. This ornament comprises an ornament base article made of a metal or a ceramic,
an underlayer formed on the base article, and
a coloring layer comprising an abrasion-resistant layer formed by dry-plating on the surface of the underlayer and an outermost layer formed by dry-plating on the surface of the abrasion-resistant layer;

the coloring layer being a white hard coating film of a stainless-steel color and being comprised of the abrasion-resistant layer of a thickness of 0.2-1.5 μm and the outermost layer of a thickness of 0.002-0.1 μm. In the case where the outermost layer is a platinum coating film or a platinum alloy coating film, the coating film has a thickness of 0.002-0.01 μm.

The underlayer is preferably a nickel-free layer formed by dry-plating or wet-plating for prevention of nickel allergy.

The first ornament of the present invention has a mixture layer composed of a metal compound forming the abrasion-resistant layer and a metal or alloy forming the outermost layer between the abrasion-resistant layer and the outermost layer.

The color evaluation values of the coloring layer according to L*a*b* color space (CIE calorimetric system) are preferably $70<L^*<91$, $-0.1<a^*<3.0$, and $1.0<b^*<5.5$, more preferably $75<L^*<85$, $0<a^*<2.0$, and $3.5<b^*<5.0$.

The Δ values of L*, a*, b* of the coloring layers formed on the ornament base articles and having variously finished surfaces are preferably in the range of $\Delta L^*=\pm 6.0$, $\Delta a^*=\pm 1.55$, and $\Delta b^*=\pm 2.25$.

The first ornament of the present invention may have at least one coating film, formed by dry-plating or wet-plating, having a color different from the color of the white coating film of the coloring layer on a part of the white coating film surface having a stainless steel color of the aforementioned coloring layer.

The coating film having a color different from the color of the coloring layer (hereinafter occasionally referred to as a "differential coloring film") is preferably composed of gold, a gold alloy, titanium nitride, zirconium nitride, hafnium nitride, or diamond-like carbon (DLC). The differential coloring film having a color different from the color of the coloring layer may have a two-layer structure which is constituted of a lower layer composed of titanium nitride, zirconium nitride, or hafnium nitride and an upper layer composed of gold or a gold alloy. The gold alloy used for formation of the differential coloring film having a color different from the coloring layer is preferably nickel-free for prevention of nickel allergy.

Further, this ornament may have a titanium coating film and a silicon coating film formed on the titanium coating film, between the coloring layer and the differential coloring diamond-like carbon (DLC) coating film.

The first ornament of the present invention may have the outermost layer which is a mixture layer composed of a mixture of metal compound of the aforementioned abrasion-resistant layer and at least one material selected from the group consisting of platinum (Pt), palladium (Pd), rhodium (Rh), and alloys thereof.

The first ornament of the present invention has a surface hardness (HV; Vickers hardness micro-tester, load: 5 g, retention time: 10 seconds) in the range of usually 700-2000, preferably 1000-2000.

The first ornament of the present invention may be used for watch exterior parts such as watchcases, watchbands, watch crowns, and watch case back covers.

The process for producing the first personal ornament of the present invention having as an outermost layer a white coating film composed of a noble metal or noble metal alloy formed by dry-plating comprises steps of producing an ornament base article from a metal or a ceramic by a working means, forming an underlayer by dry-plating or wet-plating on the surface of the base article, and forming a coloring layer having a stainless-steel color by firstly forming an abrasion-resistant layer from a metal compound on the underlayer by dry-plating and then forming an outermost layer from platinum or a platinum alloy by dry-plating on the abrasion resistant layer.

The underlayer is preferably a nickel-free film formed by dry-plating or wet-plating in view of prevention of nickel allergy.

The metal material useful for the ornament base article is normally at least one metal (including an alloy) selected from stainless steel, titanium, titanium alloys, copper, copper alloys, and tungsten carbide. The surface of the ornament base article may be finished in at least one state of a mirror surface and patterned surfaces selected from mat patterns, hair line patterns, horning patterns, stamped patterns, and etching patterns.

The ornament base article which is made of a ceramic material is produced by molding a mixture of 100 parts by weight of powdery stabilized zirconium containing yttrium oxide ($Y_2O_3$), magnesium oxide (MgO), or calcium oxide (CaO) at a content of 3-7% by weight, and 20-25 parts by weight of a binder by injection molding, and further by machining roughly, degreasing, firing, grinding, and polishing. The ornament base article has a white color.

The ornament base article which is made of a metal other than copper and copper-alloys, or made of a ceramic is preferably coated on the surface with an underlayer composed of titanium (Ti), chromium (Cr), zirconium (Zr), hafnium (Hf), vanadium (V), niobium (Nb), or tantalum (Ta) by dry-plating. However, in the case where the surface of the underlayer is coated with a metal compound coating film as a abrasion-resistant layer composed of titanium carbide (TiC), chromium carbide ($Cr_3C_2$), zirconium carbide (ZrC), hafnium carbide (HfC), vanadium carbide (VC), niobium carbide (NbC), tungsten carbide (WC), or tantalum carbide (TaC), the underlayer is more preferably a metal compound coating film formed by dry-plating from a metal carbide of carbon content of 5-15 atom % such as titanium carbide, chromium carbide, zirconium carbide, hafnium carbide, vanadium carbide, niobium carbide, tungsten carbide, or tantalum carbide. In this case, the metal of the metal carbide for forming the metal compound coating film as the underlayer is preferably the same as the metal of the metal carbide for forming the abrasion-resistant layer.

The ornament base article which is made of a metal other than copper and copper-alloys or made of a ceramic is preferably coated on the surface with the aforementioned underlayer in a thickness of 0.02-0.2 μm by dry-plating.

The ornament base article which is made of copper or a copper alloy is preferably coated on the surface with a nickel coating film in a thickness of 1-10 μm as the underlayer by wet-plating, and is further coated on the nickel coating film with an amorphous nickel-phosphorus alloy coating film in a thickness of 3-10 μm by wet-plating.

However, for prevention of nickel allergy, the ornament base article which is made of copper or a copper alloy is preferably coated on the surface thereof with a coating film as the underlayer composed of at least one material selected from the group consisting of copper, palladium, copper-tin alloys, copper-tin-zinc alloys, and copper-tin-palladium alloys in a thickness of 2-9 μm by wet-plating.

The abrasion-resistant layer is preferably a metal compound coating film composed of titanium carbide (TiC), chromium carbide ($Cr_3C_2$), zirconium carbide (ZrC), hafnium carbide (HfC), vanadium carbide (VC), niobium carbide (NbC), tungsten carbide (WC), or tantalum carbide (TaC).

The thickness of the abrasion-resistant layer is in the range of usually 0.2-1.5 μm, preferably 0.5-1.0 μm.

The outermost layer is preferably a coating film composed of at least one material selected from the group consisting of platinum (Pt), palladium (Pd), rhodium (Rh) and alloys thereof.

The thickness of the outermost coating layer is in the range of usually 0.002-0.1 μm, preferably 0.005-0.1 μm, more preferably 0.01-0.08 μm. However, when the outermost layer is formed from a platinum coating film or a platinum alloy coating film, the thickness of the film is in the range of 0.002-0.01 μm, preferably 0.005-0.01 μm.

In the present invention, between the abrasion-resistant layer and the outermost layer, a mixture layer may be formed which is composed of a metal compound forming the abrasion-resistant layer and the metal or alloy forming the outermost layer.

Each of the layers of the underlayer, the abrasion-resistant layer, the mixture layer, and the outermost layer is preferably formed by at least one method of sputtering, ion plating, and arc discharging.

In the process for producing the first ornament of the present invention, on a part of the white coating film surface constituted of the coloring layer having a stainless steel color, at least one differential coloring film having a color different from the color of the coloring layer may be formed by dry-plating or wet-plating.

The second personal ornament (accessory) of the present invention has as an outermost layer a white ornamental coating film composed of a noble metal or noble metal alloy formed by dry-plating. This ornament comprises an ornament base article of the ornament made of a metal or a ceramic, an underlayer formed on the base article, and a titanium carbide layer (abrasion-resistant layer) formed on the surface of the underlayer by dry plating, and an ornamental coating layer (outermost layer) formed on the surface of the titanium carbide layer, wherein the titanium carbide layer has a thickness of 0.5-1.0 μm, and the ornamental coating layer is a white coating film having a thickness of 0.03-0.06 μm.

The underlayer is preferably a nickel-free layer formed by dry-plating or wet-plating for prevention of nickel allergy.

Between the titanium carbide layer and the ornamental coating layer, a mixture layer may be formed which is composed titanium carbide forming the titanium carbide layer and platinum or a platinum alloy forming the ornamental coating layer, in a thickness of 0.005-0.1 μm.

Otherwise, between the titanium carbide layer and the ornamental coating layer, a stainless steel coating layer may be provided by dry-plating. This stainless steel coating layer protects the base article, the underlayer, and the titanium carbide layer against corrosion. Therefore if the plating with the platinum or the platinum alloy is unsuccessful, the formed defective platinum or platinum-alloy coating film can be removed by use of aqua regia without corrosion of the underlying layers, and the platinum or platinum-alloy coating film can be again formed on the surface of the stainless steel coating layer to regenerate the ornament. The thickness of the stainless steel coating layer is preferably in the range of 0.05-1.5 μm.

The stainless steel coating layer is preferably composed of an austenitic stainless steel having a composition of 0.01-0.12 vol % carbon, 0.1-1.5 vol % silicon, 1.0-2.5 vol % manganese, 8-22 vol % nickel, 15-26 vol % chromium, and balance of iron. The coating film layer of the austenitic stainless steel is preferably formed by at least one method of sputtering, ion-plating, and arc discharging.

The color evaluation values of the ornamental coating layer according to L*a*b* color space (CIE calorimetric system) are $85<L^*<95$, $1.5<a^*<4.0$, and $4.5<b^*<6.5$, preferably $88<L^*<92$, $1.8<a^*<2.5$, and $5.0<b^*<5.5$.

The underlayer, the titanium carbide layer, the mixture layer, and the ornamental coating layer are respectively formed preferably by at least one method of sputtering, ion-plating, and arc discharging.

The second ornament of the present invention may have, on a part of the surface of the ornamental coating layer, at least one differential coloring film having a color different from the color of the ornamental coating layer (hereinafter occasionally referred to as a "differential coloring film"), formed by dry-plating or wet-plating.

The differential coloring film having a color different from the color of the ornamental coating layer is preferably composed of any of gold, a gold alloy, titanium nitride, zirconium nitride, hafnium nitride, and a diamond-like carbon (DLC). The differential coloring film having a color different from the color of the ornamental coating layer may have a two-layer structure constituted of a lower layer composed of titanium nitride, zirconium nitride, or hafnium nitride and an upper layer composed of gold or a gold alloy. The gold alloy used for formation of the differential coloring film having a color different from the color of the ornamental coating layer is preferably selected from nickel-free gold alloys for prevention of nickel allergy.

Further, this ornament may have a titanium coating film and a silicon coating film formed on the titanium coating film, between the ornamental coating layer and the diamond-like carbon (DLC) film, having a color different from that of the ornamental coating layer.

The ornamental coating layer may be a mixture layer composed of titanium carbide forming the titanium carbide layer and platinum or a platinum alloy.

The second ornament of the present invention having a white coating film has an ornamental coating layer having a surface hardness (HV; Vickers hardness micro-tester, load: 5 g) in the range of 1000-2000.

The second ornament of the present invention may be a watch exterior part such as a watchcase, a watchband, a watch crown, and a watch case back cover.

The process for producing the second personal ornament of the present invention having a white ornamental coating film composed of a noble metal or a noble metal alloy formed by dry-plating comprises steps of producing an ornament base article from a metal or a ceramic by a working means, forming an underlayer by dry-plating or wet-plating on the surface of the base article, forming a titanium carbide layer on the surface of the underlayer by dry-plating, and forming an ornamental coating layer composed of platinum or a platinum alloy as the outermost layer by dry-plating on the titanium carbide layer.

The base article of the ornament used in this production process is the same as that of the first ornament of the present invention having a white coating film.

The underlayer formed on the surface of the base article of the ornament is the same as that constituting the first ornament of the present invention.

Between the titanium carbide layer and the ornamental coating layer in the present invention, a mixture layer may be formed which is composed of titanium carbide forming the titanium carbide layer and platinum or a platinum alloy.

Otherwise, between the titanium carbide layer and the ornamental coating layer, a stainless steel coating layer may be formed by dry-plating.

In the process for producing the second ornament of the present invention, the titanium carbide layer, and/or the mixture layer is preferably formed by dry plating by use of a methane gas.

In the process for producing the second ornament of the present invention, on a part of the white coating layer surface, at least one differential coloring film having a color different from the color of the ornamental coating layer may be formed by dry-plating or wet-plating.

Further, between the ornamental coating layer and the diamond-like carbon (DLC) coating film having a color different from that of the ornamental coating layer, a titanium coating film may be formed, and further thereon a silicon coating film may be formed.

DETAILED DESCRIPTION OF THE INVENTION

The personal ornament having a white coating film and the process for producing the ornament of the present invention are described below in more detail.

The first personal ornament of the present invention comprises an ornament base article, an underlayer preferably containing no nickel, and a coloring layer. The coloring layer comprises an abrasion-resistant layer and an outermost layer, or an abrasion-resistant layer, a mixture layer, and an outermost layer.

The first ornament of the present invention may further have, on a part of the surface of the white coating film constituting the coloring layer having a stainless steel color, at least one differential coloring film having a color different from the color of the coloring layer.

The second ornament of the present invention comprises an ornament base article, an underlayer preferably containing no nickel, a titanium carbide layer, and an ornamental coating layer (outermost layer). A stainless-steel coating layer may further be formed by dry-plating further between the titanium carbide layer and the ornamental coating layer.

Ornament Base Article

The base articles used for the first and the second personal ornaments each having a white coating film are made of a metal or a ceramic.

The aforementioned metal (including alloys) specifically includes stainless steel, titanium, titanium alloys, copper, copper alloys, and tungsten. The metal may be used singly or in combination of two or more thereof.

The aforementioned ceramic includes specifically zirconia ceramic. The useful zirconia ceramic is a stabilized zirconia containing yttrium oxide ($Y_2O_2$) or another stabilizer (such as magnesium oxide (MgO) and calcium oxide (CaO)) at a content of 3-7 wt %, and is white in color. More specifically, this zirconia ceramic comprises zirconia and a binder as the main constituents, containing 20-25 weight parts of a binder based on 100 weight parts of the stabilized powdery zirconia containing a stabilizer like yttrium oxide at a content of 3-7 wt %. This zirconia is white in color after firing. The binder is a mixture of at least two materials selected from polyethylene, polypropylene, polystyrene, polyethylene-vinyl acetate, polybutyl methacrylate, polyacetal, wax, stearic acid, and the like.

In the present invention, a zirconia ceramic containing a stabilizer like yttrium oxide (yttria) at a content of 3-7 wt % is selected as the zirconia ceramic, because at a stabilizer content of lower than 3 wt %, the molded zirconia ceramic has a lower impact strength (brittle) tending to be cracked by external impact, whereas at a stabilizer content higher than 7 wt %, the zirconia has also lower impact strength tending to be cracked by external impact. Presumably, in the above range of the stabilizer content, the zirconia ceramic has a crystal structure of a cubic-monoclinic mixed system to have stable impact resistance.

The binder is used in an amount of 20-25 weight parts based on 100 weight parts of the powdery zirconia, because at the amount of the binder of less than 20 weight parts, the ceramic has lower injection-moldability not to fill the mold completely, whereas at the amount of more than 25 weight parts, degreasing requires longer time to lower the productivity and the molded article may be breakable.

The ornament base article made of a metal is prepared by machining the metal in a conventional manner. The ornament base article may be surface-finished, as necessary, in an at least one state of a mirror surface and patterned surfaces selected from mat patterns, hair line patterns, horning patterns, stamped patterns, and etching patterns.

The ornament base article made of a ceramic is worked, for example for a watchcase as follows. A base article is prepared in a shape of a watchcase by injection molding of a material composed mainly of zirconia and a binder. The molded article is roughly machined. The roughly machined article is degreased and fired to obtain a crude article for the watchcase. This crude article is further machined by grinding and polishing.

The ornament (accessories) (including parts) in the present invention includes watch exterior parts such as watchcases, watchbands, watch crowns, and watchcase back covers, as well as belt buckles, finger rings, necklaces, bracelets, earrings, pendants, brooches, cuff buttons, necktie holders, badges, medals, eyeglass frames, camera bodies, and door knobs.

The surface of the ornament article base is preferably washed and degreased with a conventional organic solvent or the like before the formation of the underlayer on the surface in the present invention.

Underlayer

The underlayer of the first or second ornament of the present invention is a plating film formed by wet plating or dry plating.

The ornament base article which is made of a metal other than copper and copper-alloys, or made of a ceramic is preferably coated on the surface with a metal underlayer composed of titanium (Ti), chromium (Cr), zirconium (Zr), hafnium (Hf), vanadium (V), niobium (Nb), or tantalum (Ta) by dry-plating. However, in the case where the surface of the underlayer is coated with a metal compound coating film as an abrasion-resistant layer composed of titanium carbide (TiC), chromium carbide ($Cr_3C_2$), zirconium carbide (ZrC), hafnium carbide (HfC), vanadium carbide (VC), niobium carbide (NbC), tungsten carbide (WC), or tantalum carbide (TaC), the underlayer is more preferably a metal compound coating film formed from a metal carbide of carbon content of 5-15 atom % such as titanium carbide, chromium carbide, zirconium carbide, hafnium carbide, vanadium carbide, niobium carbide, tungsten carbide, or tantalum carbide. In this metal compound coating film, the carbon atom content is gradually decreased toward the ornament base article surface. Such a metal compound coating film is called a gradient film.

The metal thickness of the metal coating film and the metal compound coating film (underlayer) is preferably in the range of 0.02-0.2 µm, more preferably 0.05-0.1 µm.

The dry-plating includes physical vapor deposition (PVD) such as sputtering, arc discharging, ion plating, and ion beam projection; and CVD. Of these, particularly preferred are sputtering, arc discharging, and ion plating.

In the first or second ornament of the present invention, in the case where the ornament base article is made of copper or a copper alloy, the underlayer is preferably constituted of a nickel coating film having a thickness of 1-10 µm, preferably 1-5 µm formed by wet-plating, and an amorphous nickel-phosphorus alloy coating film formed thereon in a thickness of 3-10 µm, preferably 3-5 µm by wet-plating.

However, for prevention of nickel allergy, in the case where the ornament base article is made of cupper or a copper alloy, the underlayer is preferably a coating film composed of at least one material selected from the group consisting of copper, palladium, copper-tin alloys, copper-tin-zinc alloys, and copper-tin-palladium alloys formed by wet-plating in a thickness of 2-9 µm, preferably 2-3 µm.

Coloring Layer

The coloring layer (color-developing layer) of the first ornament of the present invention comprises an abrasion-resistant layer and an outermost layer; or an abrasion-resistant layer, a mixture layer, and an outermost layer.

The coloring layer of the second ornament of the present invention comprises a titanium carbide layer (abrasion-resistant layer) and an ornamental coating layer (outermost layer); or a titanium carbide layer (abrasion-resistant layer), a stainless steel coating layer, and an ornamental coating layer (outermost layer); or titanium carbide layer (abrasion-resistant layer), a mixture layer, and an ornamental coating layer (outermost layer).

These layers are formed by dry plating. The dry-plating method includes, specifically, physical vapor deposition (PVD) such as sputtering, arc discharging, ion plating, and ion beam projection; and CVD. Of these, particularly preferred are sputtering, arc discharging, and ion plating.

Abrasion-Resistant Layer

The aforementioned abrasion-resistant layer is a metal compound coating film formed on the underlayer surface by dry plating.

In the first ornament of the present invention, the abrasion-resistant layer is preferably constituted of a metal compound coating film formed from titanium carbide (TiC), chromium carbide ($Cr_3C_2$), zirconium carbide (ZrC), hafnium carbide (HfC), vanadium carbide (VC), niobium carbide (NbC), tungsten carbide (WC), or tantalum carbide (TaC).

In the second ornament of the present invention, in which the titanium carbide layer serves as the abrasion-resistant layer, the metal compound coating film for the abrasion-resistant layer is a titanium carbide coating film.

The abrasion-resistant layer has a thickness of 0.2-1.5 µm, preferably 0.5-1.0 µm.

Stainless Steel Coating Layer

The stainless steel coating layer may be provided for constituting the second ornament of the present invention. This layer is formed between the titanium carbide layer and the ornamental coating layer to enable regeneration of the ornament article. When a formed ornamental coating layer is found to be unsuccessful (irregularity in the formed ornamental coating layer, etc.), the formed defective ornamental coating layer is removed by use of aqua regia. The aqua regia not only removes the ornamental coating layer but also corrodes the titanium carbide layer, the underlayer, and the surface of the ornament base article, making impracticable the regeneration of the ornament. The stainless steel coating layer is provided to solve this problem. In removal of the ornamental coating layer by aqua regia, the stainless steel coating layer protects the titanium carbide layer, the underlayer, and the surface of the ornament base article against the corrosion. Accordingly, the ornament having a defective ornamental coating layer can be regenerated by removing the defective ornamental coating layer by aqua regia and forming again the ornamental coating layer on the stainless steel coating film surface.

The stainless steel coating layer is formed by sputtering for dry plating in a thickness in the range of 0.05-1.5 µm. The stainless steel coating layer is preferably composed of austenitic stainless steel having a composition of 0.01-0.12 vol % carbon, 0.1-1.5 vol % silicon, 1.0-2.5 vol % manganese, 8-22 vol % nickel, 15-26 vol % chromium, and balance of iron.

Outermost Layer

The outermost layer of the first ornament of the present invention is a coating film composed of a noble metal (including an alloy thereof) formed by dry plating on the surface of the abrasion-resistant layer or on the surface of the mixture layer mentioned later.

Such a noble metal coating film is formed from at least one noble metal selected from the group consisting of platinum (Pt), palladium (Pd), rhodium (Rh), and alloys thereof.

This first ornament may employ the mixture layer mentioned later as the outermost layer.

The thickness of the outermost layer is 0.002-0.1 µm, preferably 0.005-0.1 µm, more preferably 0.01-0.08 µm. However, in the case where the outermost layer is constituted of a platinum coating film or a platinum alloy coating film, the film thickness is 0.002-0.01 µm, preferably 0.05-0.08 µm.

The ornamental coating layer as the outermost layer of the second ornament of the present invention is a coating film of platinum or a platinum alloy as the noble metal formed by dry plating on the surface of the titanium carbide layer (abrasion-resistant layer) having been formed by dry plating, or on the surface of a mixture layer mentioned later.

The ornamental coating layer of this second ornament may be the mixture layer (a mixture layer composed of titanium carbide forming the titanium carbide layer and platinum or a platinum alloy) mentioned later.

The thickness of the ornamental coating layer is 0.02-0.1 µm, preferably 0.03-0.06 µm.

The alloy for forming the outermost layer of the ornamental coating layer is preferably nickel-free.

Mixture Layer

The first ornament of the present invention may have, as necessary, a mixture layer formed between the abrasion-resistant layer and the outermost layer. This mixture layer is a coating film formed by dry-plating.

This coating film is composed of a metal compound forming the abrasion-resistant layer (e.g., titanium carbide) and a metal or an alloy forming the outermost layer (e.g., platinum or a platinum alloy). The thickness of this mixture layer is usually 0.005-0.1 µm, preferably 0.0.1-0.08 µm. This mixture layer will make stronger the adhesion between the abrasion-resistant layer and the outermost layer.

The coloring layer comprising the abrasion-resistant layer and the outermost layer, or comprising the abrasion-resistant layer, the mixture layer, and the outermost layer has color evaluation values according to L*a*b* color space (CIE calorimetric system) in the range of preferably 70<L*<91, −0.1<a*<3.0, and 1.0<b*<5.5, more preferably 75<L*<85, 0<a*<2.0, and 3.5<b*<5.0.

The coloring layer formed on a mirror-polished ornamental base article, and the coloring layer formed on a hair-line-finished (fine line-patterned) ornamental base article had respectively color evaluation values according to L*a*b* color space (CIE calorimetric system) in the range of 85<L*<90, 0<a*<2.0, and 3.5<b*<5.0; and 75<L*<85, 0<a*<2.0, and 3.5<b*<5.0.

The Δ values of L*, a*, b* of the coloring layers formed on the ornament base articles having surfaces finished variously were in the range of $\Delta L^* = \pm 6.0$, $\Delta a^* = \pm 1.55$, and $\Delta b^* = \pm 2.25$.

The coloring layer has a surface hardness (HV: Vickers hardness micro-tester, load: 5 g, retention time; 10 seconds) in the range of usually 700-2000, preferably 1000-2000.

Owing to the presence of at least the abrasion-resistant layer of thickness of 0.2-1.5 µm and the outermost layer of a noble metal of thickness of 0.002-0.1 µm on the underlayer surface, the first ornament of the present invention has superior quality, being less liable to deterioration of appearance quality by scratching or other causes, and having a white coating film having appearance like a stainless steel coating film.

The second ornament of the present invention may have, as necessary, a mixture layer formed between the titanium carbide layer and the ornamental coating layer. The mixture layer is formed by dry-plating.

This coating film is composed of titanium carbide forming the titanium carbide layer and platinum or a platinum alloy forming the ornamental coating layer. The thickness of this mixture layer is usually 0.005-0.04 µm, preferably 0.008-0.03 µm. This mixture layer will make stronger the adhesion between the titanium carbide layer and the ornamental coating layer.

The coloring layer comprising the titanium carbide layer and the ornamental coating layer; or comprising the titanium carbide layer, the mixture layer, and the ornamental coating layer has color evaluation values according to L*a*b* color space (CIE calorimetric system) in the range of preferably 85<L*<95, 1.5<a*<4.0, and 4.5<b*<6.5, more preferably 88<L*<92, 1.8<a*<2.5, and 5.0<b*<5.5.

The coloring layer formed on a mirror-polished ornamental base article, and the coloring layer formed on a hair-line-finished (fine line-patterned) ornamental base article had respectively color evaluation values according to L*a*b* color space (CIE calorimetric system) in the range of 85<L*<90, 0<a*<2.0, and 3.5<b*<5.0; and 75<L*<85, 0<a*<2.0, and 3.5<b*<5.0.

The Δ values of L*, a*, b* of the coloring layer formed on the ornament base articles having surfaces finished variously were in the range of $\Delta L^* = \pm 6.0$, $\Delta a^* = \pm 1.55$, and $\Delta b^* = \pm 2.25$.

The surface layer comprising the titanium carbide layer and the ornamental coating layer; or comprising the titanium carbide layer, the mixture layer, and the ornamental coating layer has a surface hardness (HV: Vickers hardness micro-tester, load: 5 g, retention time: 10 seconds) in the range of usually 700-2000, preferably 1000-2000.

Owing to the presence of at least the titanium carbide coating layer of a thickness of 0.5-1.0 µm and the ornamental coating layer of a thickness of 0.03-0.06 µm on the underlayer surface, the second ornament of the present invention is less liable to deteriorate in appearance quality by scratching or other causes, and has a white coating-film giving superior quality.

Additional Coating Film on Coloring Film

The first ornament of the present invention may be provided with at least one additional film (differential coloring film) formed by dry-plating or wet-plating having a color different from the color of the coloring layer on a part of the white coating film having a stainless steel color.

The second ornament of the present invention may be provided with at least one additional film (differential coloring film) formed by dry-plating or wet-drying having a color different from the color of the coloring layer on a part of the surface of the white coating film having a platinum color or a platinum-alloy color.

The differential coloring film is preferably composed of gold, a gold alloy (preferably nickel-free gold alloy), titanium nitride, zirconium nitride, hafnium nitride, or diamond-like carbon (DLC). This coating film is visible as well as the outermost coloring layer. Therefore, the ornament of the present invention includes two-tone ornaments and the like.

The thickness of the plated differential coloring film is in the range of usually 0.1-1.0 µm, preferably 0.2-0.5 µm.

This differential coloring film may have a two-layer structure constituted of a lower layer composed of titanium nitride, zirconium nitride, or hafnium nitride, and an upper layer composed of gold, or a gold alloy (preferably nickel-free gold alloy; e.g., a gold-iron alloy). In this structure, the lower layer has a thickness of usually 0.2-1.5 µm, preferably 0.5-1.0 µm, and the upper layer has a thickness of usually 0.03-0.2 µm, preferably 0.05-0.1 µm.

Further, this differential coloring coating film may have a three-layer structure constituted of a lower layer composed of titanium, an intermediate layer composed of titanium nitride, zirconium nitride, or hafnium nitride, and an upper layer composed of gold, or a gold alloy (preferably a nickel-free gold alloy). In such a structure, the lower layer has a thickness of usually 0.02-0.1 µm, preferably 0.03-0.08 µm, the intermediate layer has a thickness of usually 0.2-1.5 µm, preferably 0.5-1.0 µm, and the upper layer has a thickness of usually 0.03-0.2 µm, preferably 0.05-0.1 µm.

Furthermore, this differential coloring coating film may be constituted of a titanium coating film, a silicon coating film, and a diamond-like carbon (DLC) coating film formed in this order on a part of the coloring layer surface. In this structure, the lower layer has a thickness of usually 0.05-0.3 µm, preferably 0.08-0.2 µm, the intermediate layer has a thickness of usually 0.05-0.3 µm, preferably 0.08-0.2 µm, and the upper layer has a thickness of usually 0.5-3.0 µm, preferably 0.8-1.5 µm.

The respective layers constituting the aforementioned monolayer structures, two-layer structures, and the three-layer structures are formed usually dry-plating. The dry-plating includes, specifically, physical vapor deposition (PVD) such as sputtering, arc discharging, ion plating, and ion beam projection; and CVD. Of these, particularly preferred are sputtering, arc discharging, and ion plating.

The differential coloring coating film may have a two-layer structure constituted of a lower layer composed of a gold strike-plated film formed by wet-plating, and an upper layer composed of gold or a gold alloy (preferably nickel-free gold alloy coating film) formed by wet-plating. In this structure, the lower layer has a thickness of usually 0.05-0.2 µm, preferably 0.05-0.1 µm, and the upper layer has a thickness of usually 1.0-10 µm, preferably 1.0-3.0 µm.

Such an ornament having a differential coloring coating film on a part of the coloring layer surface can be produced, for example, by the process shown below.

Firstly, an underlayer is formed on the ornament base article surface. On the surface of this underlayer, the aforementioned coloring layer is formed. A part of the surface of the coloring layer is treated for masking. The surface of the coloring layer and the surface of the mask are covered with a plating film having a color different from the color of the coloring layer by dry-plating or wet-plating. Thereafter, the mask is removed together with a plated coating film formed thereon. The steps of masking, plating, and mask removal are conducted at least once. Thereby, the outermost coating film can be produced which has two or more color tones having a white coating film of a stainless steel color or a white coating film of a platinum color or a platinum alloy color, and at least one differential coloring plating film.

The ornament of the present invention gives superior quality, having high scratch-resistance not to deteriorate in the external appearance by scratching or other causes, and having a white coating film of high-quality image like that of stainless steel. A process is provided for producing the ornament. Another ornament of the present invention will not cause nickel metal allergy, and yet gives superior quality, having high scratch-resistance not to deteriorate in the external appearance by scratching or other causes, and having a white coating of high-quality image like that of stainless steel. A process is provided for producing the ornament.

A still another ornament of the present invention gives superior quality with a characteristic color of platinum or a platinum alloy, having high hardness not to deteriorate in the external appearance by denting, scratching, or other causes, having a white coating film of superior quality, and being producible at a low cost. A process is provided for producing the ornament. The ornament of the present invention may have a stainless steel coating layer between the titanium layer and the ornamental coating layer. Thereby, when the platinum or platinum-alloy coating film as formed is found to have a defect like color irregularity, the defective film can be regenerated by removing the platinum or platinum-alloy coating film by use of aqua regia without causing corrosion of the ornament base article, the underlayer, and the titanium carbide layer, and by forming, after the film removal, another platinum or platinum-alloy coating film. A process for producing the ornament is also provided.

EXAMPLES

The present invention is explained by reference to Examples without limiting the invention in any way.

Example A1

A watchcase base article and a watchband base article having been prepared from stainless steel (SUS316L) by machining were washed and degreased with an organic solvent. Incidentally the surfaces of the base articles had been finished in a hairline pattern by machining.

The base articles were set in an ion plating apparatus, and the surfaces of the base articles were cleaned by bombardment in an argon atmosphere.

Then on the surfaces of the base articles, a titanium plating film (underlayer) was formed in a thickness of 0.05 µm by ion plating (hot cathode method) under the film formation conditions below.

| <Film Formation Conditions> | |
|---|---|
| Evaporation source: | Titanium |
| Electron gun: | 10 kV, 200-500 mA |
| Gas: | Argon gas |
| Film formation pressure: | 0.004-0.009 Pa |
| Acceleration voltage (bias voltage): | Ground to −100 V |
| Anode voltage: | 50 V |
| Filament voltage: | 7 V |

On the respective surfaces of the titanium plating films formed on the base articles, a white titanium carbide plating film (abrasion-resistant layer) was formed in a thickness of 0.6 µm by ion plating (hot cathode method) under the film formation conditions below.

| <Film Formation Conditions> | |
|---|---|
| Evaporation source: | Titanium |
| Electron gun: | 10 kV, 300 mA |
| Gas: | Methane gas |
| Film formation pressure: | 0.02 Pa |
| Acceleration voltage (bias voltage): | Ground to −100 V |
| Anode voltage: | 60 V |
| Filament voltage: | 7 V |

On the respective surfaces of the plated titanium carbide films formed on the base articles, a white-colored mixture plating film (mixture layer) of titanium carbide and platinum was formed in a thickness of 0.05 µm by ion plating (hot cathode method) under the film formation conditions below.

| <Film Formation Conditions> | |
|---|---|
| Evaporation source: | Titanium, platinum |
| Electron gun: | 10 kV, 300 mA (source: titanium) |
| | 10 kV, 500 mA (source: platinum) |
| Gas: | Methane gas |
| Film formation pressure: | 0.02 Pa |
| Acceleration voltage (bias voltage): | Ground to −50 V |
| Anode voltage: | 60 V |
| Filament voltage: | 7 V |

On the respective surfaces of the mixture-plating films of titanium carbide and platinum on the base articles, a white-colored platinum coating film (outermost layer) was formed in a thickness of 0.005 μm by ion plating (hot cathode method) under the conditions below to obtain a watchcase and a watchband of a stainless steel color.

| <Film Formation Conditions> | |
|---|---|
| Evaporation source: | Platinum |
| Electron gun: | 10 kV, 500 mA |
| Gas: | Argon gas |
| Film formation pressure: | 0.2 Pa |
| Acceleration voltage (bias voltage): | Ground to −50 V |
| Anode voltage: | 60 V |
| Filament voltage: | 7 V |

The platinum coating films formed as above on the surfaces of the watchcase and the watchband had a surface hardness of 1400 (HV: Vickers hardness micro-tester, load: 5 g, retention time: 10 seconds). The watchcase and the watchband had a white coating film formed thereon having high scratch resistance and giving high-quality image similar to stainless steel coating film.

The color evaluation values of the coloring layers according to $L^*a^*b^*$ color space (CIE calorimetric system) were $82<L^*<85$, $0<a^*<2.0$, and $4.0<b^*<5.0$.

Example A2

A watchcase base article and a watchband base article having been prepared from brass (copper alloy) by machining were washed and degreased with an organic solvent. Incidentally the surfaces of the base articles had been finished in a hairline pattern by machining.

The base articles were set in a sputtering apparatus, and the surfaces of the base articles were cleaned by bombardment in an argon atmosphere.

The above base articles were immersed in a plating solution having the composition below, and electrically plated under the plating conditions below to form a copper-tin alloy plating film (underlayer 1) in a thickness of 2 μm on the base article surfaces. The formed plating films were washed with water.

| <<Copper-Tin Plating>> | |
|---|---|
| <Composition of Plating Solution> | |
| Copper cyanide | 15 g/L (in terms of copper) |
| Sodium stannate | 15 g/L (in terms of tin) |
| Zinc cyanide | 1 g/L (in terms of zinc) |
| KOH | 20 g/L |
| KCN (free) | 30 g/L |
| Brightener | 10 mL/L |
| <Plating Conditions> | |
| pH | 12.5 (at 50° C.) |
| Solution temperature | 50° C. |
| Current density (Dk) | 2 A/dm² |
| Film formation rate | 3 min/1 μm |

The above base articles coated with the copper-tin alloy plating film were immersed in a plating solution having the composition below, and electrically plated under the plating conditions below to form a copper-tin-zinc alloy plating film (underlayer 2) in a thickness of 2 μm on the respective copper-tin alloy plating film surfaces. The formed plating films were washed with water.

| <<Copper-Tin-Zinc Alloy Plating>> | |
|---|---|
| <Composition of Plating Solution> | |
| Copper cyanide | 8.5 g/L (in terms of copper) |
| Sodium stannate | 34.0 g/L (in terms of tin) |
| Zinc cyanide | 1 g/L (in terms of zinc) |
| KOH | 20 g/L |
| KCN (free) | 50 g/L |
| Brightener 1 | 5 mL/L |
| Brightener 2 | 5 mL/L |
| <Plating Conditions> | |
| pH | 13.0 (at 50° C.) |
| Solution temperature | 60° C. |
| Current density (Dk) | 2 A/dm² |
| Film formation rate | 3 min/1 μm |

The above base articles coated with the copper-tin-zinc alloy plating film were immersed in a plating solution having the composition below, and electrically plated under the plating conditions below to form a palladium strike plating film (underlayer 3) in a thickness of 0.5 μm on the copper-tin-zinc plating film surfaces. The formed plating film was washed with water.

| <<Palladium Strike Plating>> | |
|---|---|
| <Composition of Plating Solution> | |
| Pure palladium | 1-3 g/L |
| <Plating Conditions> | |
| pH | 8 |
| Solution temperature | 32° C. |
| Current density (Dk) | 3-5 A/dm² |
| Time | 30 seconds |

The base articles were set in a sputtering apparatus, and the surfaces of the base articles were cleaned by bombardment in an argon atmosphere.

On the palladium strike plated coating surfaces, a tantalum coating film (underlayer 4) was formed in a thickness of 0.05 μm by sputtering (magnetron sputtering system) under the film formation conditions below.

| <Film Formation Conditions> | |
|---|---|
| Target: | Tantalum |
| Sputtering gas: | Argon gas |
| Film formation pressure: | 0.4 Pa |
| Power applied to target: | 0.5 kW |
| Bias voltage (acceleration voltage): | −50 V |

On the respective tantalum plating film surfaces formed on the base articles, a white-colored tantalum carbide coating film (abrasion-resistant layer) was formed in a thickness of 0.6 μm by sputtering (magnetron sputtering system) under the conditions below.

| <Film Formation Conditions> | |
|---|---|
| Target: | Tantalum |
| Sputtering gas: | Methane-argon gas mixture |

-continued

| <Film Formation Conditions> | |
|---|---|
| Film formation pressure: | 0.665 Pa |
| Power applied to target: | 0.5 kW |
| Bias voltage (acceleration voltage): | −50 V |

Finally, on the tantalum carbide plating film surfaces formed on the base articles, a white-colored palladium coating film (outermost layer) was formed in a thickness of 0.005 μm by sputtering (magnetron sputtering system) under the conditions below to obtain a watchcase and a watchband of a stainless steel color.

| <Film Formation Conditions> | |
|---|---|
| Target: | Palladium |
| Sputtering gas: | Argon gas |
| Film formation pressure: | 0.4 Pa |
| Power applied to target: | 0.5 kW |
| Bias voltage (acceleration voltage): | −50 V |

The palladium coating films formed as above on the surfaces of the watchcase and watchband had a surface hardness of 1300 (HV: Vickers hardness micro-tester, load: 5 g, retention time: 10 seconds). The watch case and the watchband had a white coating film having high scratch resistance and giving high-quality image similar to stainless steel coating film.

The color evaluation values of the coloring layers were 82<$L^*$<85, 0<$a^*$<2.0, and 4.0<$b^*$<5.0 according to $L^*a^*b^*$ color space (CIE calorimetric system).

Example A3

A watchcase base article and a watchband base article having been prepared from stainless steel (SUS316L) by machining were washed and degreased with an organic solvent. Incidentally the surfaces of the base articles had been finished in a hairline pattern by machining.

The base articles were set in an ion plating apparatus, and the surfaces of the base articles were cleaned by bombardment in an argon atmosphere.

On the respective surfaces of the base articles, a titanium plating film (underlayer) was formed in a thickness of 0.05 μm by ion plating (hot cathode method) under the film formation conditions below.

| < Film Formation Conditions > | |
|---|---|
| Evaporation source: | Titanium |
| Electron gun: | 10 kV, 200-500 mA |
| Gas: | Argon gas |
| Film formation pressure: | 0.004-0.009 Pa |
| Acceleration voltage (bias voltage): | Ground to −100 V |
| Anode voltage: | 50 V |
| Filament voltage: | 7 V |

On the respective surfaces of the titanium plating films formed on the base articles, a white titanium carbide plating film (abrasion-resistant layer) was formed in a thickness of 0.6 μm by ion plating (hot cathode method) under the film formation conditions below.

| < Film Formation Conditions > | |
|---|---|
| Evaporation source: | Titanium |
| Electron gun: | 10 kV, 300 mA |
| Gas: | Methane-argon gas mixture |
| Film formation pressure: | 0.02 Pa |
| Acceleration voltage (bias voltage): | Ground to −100 V |
| Anode voltage: | 60 V |
| Filament voltage: | 7 V |

On the respective surfaces of the plating films of titanium carbide films formed on the base articles, a white-colored platinum coating film (outermost layer) was formed in a thickness of 0.005 μm by ion plating (hot cathode method) under the conditions below to obtain a watchcase and a watchband of a stainless steel color.

| < Film Formation Conditions > | |
|---|---|
| Evaporation source: | Platinum |
| Electron gun: | 10 kV, 500 mA |
| Gas: | Argon gas |
| Film formation pressure: | 0.2 Pa |
| Acceleration voltage (bias voltage): | Ground to −50 V |
| Anode voltage: | 60 V |
| Filament voltage: | 7 V |

The platinum coating films formed as above on the surfaces of the watchcase and watchband had a surface hardness of 1200 (HV: Vickers hardness micro-tester, load: 5 g, retention time: 10 seconds) The watchcase and watchband had a white coating film formed thereon having high scratch resistance and giving high-quality image similar to stainless steel coating film.

The color evaluation values of the coloring layers were 82<$L^*$<85, 0<$a^*$<2.0, and 4.0<$b^*$<5.0 according to $L^*a^*b^*$ color space (CIE colorimetric system).

Example A4

On a part of the surfaces of hard films of a stainless steel color (platinum coating films) formed in the same manner as in Example A3, a plating film having a color different from the color of the hard film (differential coloring film) was formed by dry-plating.

Specifically, on the hard coating film surfaces, a titanium plating film was formed in a thickness of 0.05 μm by ion plating (hot cathode method) under the film formation conditions below.

| < Film Formation Conditions > | |
|---|---|
| Evaporation source: | Titanium |
| Electron gun: | 10 kV, 200-500 mA |
| Gas: | Argon gas |
| Film formation pressure: | 0.2 Pa |
| Acceleration voltage (bias voltage): | Ground to −100 V |
| Anode voltage: | 40-50 V |
| Filament voltage: | 7 V |

On the surface of the titanium plating film, a titanium nitride plating film giving a golden color was formed in a thickness of 0.6 μm by ion plating (hot cathode method) under the film formation conditions below.

< Film Formation Conditions >

| | |
|---|---|
| Evaporation source: | Titanium |
| Electron gun: | 10 kV, 200-500 mA |
| Gas: | Argon-nitrogen gas mixture |
| Film formation pressure: | 0.2 Pa |
| Acceleration voltage (bias voltage): | Ground to −100 V |
| Anode voltage: | 40-50 V |
| Filament voltage: | 7 V |

On the surfaces of the titanium nitride plating films, a gold-iron alloy plating film giving a golden color was formed in a thickness of 0.1 μm by ion plating (hot cathode method) under the film formation conditions below.

< Film Formation Conditions >

| | |
|---|---|
| Evaporation source: | Gold-iron alloy |
| Electron gun: | 8 kV, 500 mA |
| Gas: | Argon gas |
| Film formation pressure: | 0.26 Pa |
| Acceleration voltage (bias voltage): | Ground to −100 V |
| Anode voltage: | 10-30 V |
| Filament voltage: | 7 V |

A part of the gold-iron alloy plating film was treated for masking (with an epoxy resist as the masking material). The gold-iron alloy plating film, the titanium nitride plating film, and the titanium plating film were removed successively by etching solutions. Finally, the mask was removed. Thereby, a watchcase and a watchband were obtained which had an outermost two-tone coating film having a hard stainless steel-colored coating film and a gold-colored gold-iron alloy plating film.

The etching solution (peeling liquid) employed for removal of the gold-iron alloy plating film was a solution containing a cyanide compound as the main component and additionally an oxidant. The etching solution for the titanium nitride plating film and for titanium plating film was a solution containing nitric acid as the main component and additionally ammonium fluoride. The mask-peeling liquid employed was methylene chloride.

The platinum coating films formed as above on the surfaces of the watchcase and the watchband had a surface hardness of 1200 (HV: Vickers hardness micro-tester, load: 5 g, retention time: 10 seconds), and the gold-iron alloy plating film had a surface hardness of 120 (HV: Vickers hardness micro-tester, load: 5 g, retention time: 10 seconds). The watchcase and watchband had a white coating film formed thereon having high scratch resistance and giving high-quality image similar to stainless steel coating film.

The color evaluation of outermost layers (white coating films) constituting the coloring layer were $82<L^*<85$, $0<a^*<2.0$, and $4.0<b^*<5.0$ according to $L^*a^*b^*$ color space (CIE calorimetric system).

Example A5

On a part of the surfaces of hard films of a stainless steel color (platinum coating films) formed in the same manner as in Example A3, a plating film having a color different from the color of the hard film (differential coloring film) was formed by wet-plating.

Specifically, the base articles having the hard coating film formed thereon were subjected to pretreatment of electrolytic degreasing, neutralization and water washing for cleaning.

These hard film-coated base articles were electroplated in a plating solution having the composition below under the electroplating conditions below. Thereby a gold strike-plating film was formed in a thickness of 0.1 μm on the hard coating film surface. The films were washed with water.

<< Gold Strike Plating >>

< Composition of Plating Solution >

| | |
|---|---|
| Gold | 3-5 g/L |
| Sulfuric acid | 10 g/L |

< Plating Conditions >

| | |
|---|---|
| pH | $0.3 \leq pH < 1$ |
| Solution temperature | 25° C. |
| Current density (Dk) | 3-5 A/dm² |
| Time | 30 seconds |

This base article having the gold strike-plating film was electroplated in the plating solution having the composition below under the electroplating conditions below. Thereby a gold-iron alloy plating film was formed in a thickness of 2.0 μm on the gold strike plating film surfaces. The formed films were washed with water.

<< Gold-Iron Alloy Plating >>

< Composition of Plating Solution >

| | |
|---|---|
| Potassium cyanide | 8.7 g/L (Metal 5.0 g/L) |
| Iron chloride | 2.7 g/L (Metal 1.0 g/L) |
| Citric acid | 150 g/L or more |
| Sodium citrate | 150 g/L or more |
| Brightener | 10 mL/L |

< Plating Conditions >

| | |
|---|---|
| pH | 3.5-3.7 |
| Bath temperature | 37-40° C. |
| Current density (Dk) | 1.0-1.5 A/dm² |
| Be (Baumé specific gravity) | 20 |

The gold-iron alloy plating film was locally treated for masking. The gold-iron alloy plating film, and the gold strike-plating film were removed successively by etching solutions. Finally, the mask was removed. Thereby, a watchcase and a watchband were obtained which had an outermost two-tone coating film having a stainless steel-color hard coating film and a gold-color gold-iron alloy plating film.

The etching solution (peeling liquid) employed for removal of the gold-iron alloy plating film and removal of gold strike plating film was a solution containing a cyanide compound as the main component and additionally an oxidant. The mask-peeling liquid employed was methylene chloride.

The platinum coating films formed as above on the surfaces of the watchcase and the watchband had a surface hardness of 1100 (HV: Vickers hardness micro-tester, load: 5 g, retention time: 10 seconds), and the gold-iron alloy plating film had a surface hardness of 120 (HV: Vickers micro-hardness tester, load: 5 g, retention time: 10 seconds). The watchcase and the watchband had a white coating film formed thereon having high scratch resistance and giving high-quality image similar to stainless steel coating film.

The color evaluation values of the outermost layers (white coating films) constituting the coloring layers were 82<L*<85, 0<a*<2.0, and 4.0<b*<5.0 according to L*a*b* color space (CIE calorimetric system).

Example A6

On a part of the surfaces of hard films of a stainless steel color (platinum coating films) formed in the same manner as in Example A3, a plating film having a color different from the color of the hard film (differential coloring layer) was formed by dry-plating.

Specifically, a masking material (an epoxy resist) was applied onto a part of the surfaces of the hard films, and was dried. On the hard film surfaces and the mask material surfaces, a titanium plating film was formed in a thickness of 0.05 μm by sputtering (magnetron sputtering system) under the film formation conditions below.

| < Film Formation Conditions > | |
|---|---|
| Target: | Titanium |
| Sputtering gas: | Argon gas |
| Film formation pressure: | 0.02 Pa |
| Power applied to target: | 0.3-0.5 kW |
| Bias voltage (acceleration voltage): | −50 to −100 V |

On the titanium plating film surfaces, a silicon plating film was formed in a thickness of 0.1 μm by sputtering (magnetron sputtering system) under the film formation conditions below.

| < Film Formation Conditions > | |
|---|---|
| Target: | Silicon |
| Sputtering gas: | Argon gas |
| Film formation pressure: | 0.05 Pa |
| Power applied to target: | 0.3-0.5 kW |
| Bias voltage (acceleration voltage): | −50 to −100 V |

Then, on the silicon plating film surfaces, a black diamond-like carbon (DLC) plating film was formed in a thickness of 0.1 μm by plasma CVD (chemical vapor deposition) under the film formation conditions below.

| < Film Formation Conditions > | |
|---|---|
| Gas: | Benzene |
| Film formation pressure: | 0.2 Pa |
| Filament current: | 20 A |
| Anode current: | 2.0 A |
| Cathode voltage (acceleration voltage): | −1.0 to −5.0 kV |

Finally, the masking material was etched by methylene chloride to lift off the titanium plating films, silicon plating films and DCL plating films formed just on the masks. As the result, a watchcase and a watchband were obtained which have respectively an outermost two-tone coating film.

The platinum coating films formed as above on the surfaces of the watchcase and watchband had a surface hardness of 1200 (HV: Vickers hardness micro-tester, load: 5 g, retention time: 10 seconds), and the DLC plating films had a surface hardness of 1800 (HV: Vickers hardness micro-tester, load: 5 g, retention time: 10 seconds). The watchcase and the watchband had a white coating film having high scratch resistance and giving high-quality image similar to stainless steel coating film.

The color evaluation values of the outermost layers (white coating films) constituting the coloring layers were 82<L*<85, 0<a*<2.0, and 4.0<b*<5.0 according to L*a*b* color space (CIE calorimetric system).

Example A7

A watchcase base article and a watchband base article having been prepared from titanium by machining were washed and degreased with an organic solvent. Incidentally the surfaces of the base articles had been finished in a hairline pattern by machining.

The base articles were set in a sputtering apparatus, and the surfaces of the base articles were cleaned by bombardment in an argon atmosphere.

On the surfaces of the base articles, a zirconium plating film (underlayer) was formed in a thickness of 0.05 μm by sputtering (magnetron sputtering system) under the film formation conditions below.

| < Film Formation Conditions > | |
|---|---|
| Target: | Zirconium |
| Sputtering gas: | Argon gas |
| Film formation pressure: | 0.5 Pa |
| Power applied to target: | 0.5 kW |
| Bias voltage (acceleration voltage): | −50 V |

On the respective surfaces of the zirconium plating films formed on the base articles, a white-colored zirconium carbide coating film (abrasion-resistant layer) was formed in a thickness of 0.6 μm by sputtering (magnetron sputtering system) under the conditions below.

| < Film Formation Conditions > | |
|---|---|
| Target: | Zirconium |
| Sputtering gas: | Methane-argon gas mixture |
| Film formation pressure: | 0.665 Pa |
| Power applied to target: | 0.5 kW |
| Bias voltage (acceleration voltage): | −50 V |

Finally, on the surfaces of the zirconium carbide plating films formed on the base articles, a white-colored platinum coating film (outermost layer) was formed in a thickness of 0.005 μm by sputtering (magnetron sputtering system) under the conditions below to obtain a watchcase and a watchband of a stainless steel color.

| < Film Formation Conditions > | |
|---|---|
| Target: | Platinum |
| Sputtering gas: | Argon gas |
| Film formation pressure: | 0.2 Pa |
| Power applied to target: | 0.5 kW |
| Bias voltage (acceleration voltage): | −50 V |

The platinum coating films formed as above on the surfaces of the watchcase and watchband had a surface hardness of 1300 (HV: Vickers hardness micro-tester, load: 5 g, retention time: 10 seconds). The watchcase and watchband had a white coating film having high scratch resistance and giving high-quality image similar to stainless steel coating film.

The color evaluation values of the coloring layers were $82<L^*<85$, $0<a^*<2.0$, and $4.0<b^*<5.0$ according to $L^*a^*b^*$ color space (CIE calorimetric system).

Example A8

A watchcase base article and a watchband base article having been prepared by molding a zirconia ceramic in a shape of a watchcase and a watchband were washed and degreased with an organic solvent. (The method of preparing such a base article such as a watchcase is described specifically in the specification of Japanese Patent Application No. 2001-333236 (filed on Oct. 30, 2001) (Paragraphs: [0032]-[0036]) by inventors of the present invention) which is incorporated by reference herein. Incidentally the surfaces of the base articles had been finished in a hairline pattern by machining.

The base articles were set in an ion plating apparatus, and the surfaces of the base articles were cleaned by bombardment in an argon atmosphere.

On the respective surfaces of the base articles, a chromium plating film (underlayer) was formed in a thickness of 0.05 μm by ion plating (hot cathode method) under the film formation conditions below.

| < Film Formation Conditions > | |
|---|---|
| Evaporation source: | Chromium |
| Electron gun: | 10 kV, 300 mA |
| Gas: | Argon gas |
| Film formation pressure: | 0.004-0.009 Pa |
| Acceleration voltage (bias voltage): | Ground to −100 V |
| Anode voltage: | 60 V |
| Filament voltage: | 7 V |

On the respective surfaces of the chromium plating films formed on the base articles, a white chromium carbide plating film (abrasion-resistant layer) was formed in a thickness of 0.6 μm by ion plating (hot cathode method) under the film formation conditions below.

| < Film Formation Conditions > | |
|---|---|
| Evaporation source: | Chromium |
| Electron gun: | 10 kV, 300 mA |
| Gas: | Methane-argon gas mixture |
| Film formation pressure: | 0.02 Pa |
| Acceleration voltage (bias voltage): | Ground to −100 V |
| Anode voltage: | 60 V |
| Filament voltage: | 7 V |

On the respective surfaces of the plating films of chromium carbide on the base articles, a white-colored palladium coating film (outermost layer) was formed in a thickness of 0.005 μm by ion plating (hot cathode method) under the conditions below to obtain a watchcase and a watchband of a stainless steel color.

| < Film Formation Conditions > | |
|---|---|
| Evaporation source: | Palladium |
| Electron gun: | 10 kV, 500 mA |
| Gas: | Argon gas |
| Film formation pressure: | 0.2 Pa |
| Acceleration voltage (bias voltage): | Ground to −50 V |
| Anode voltage: | 60 V |
| Filament voltage: | 7 V |

The palladium coating films formed as above on the surfaces of the watchcase and the watchband had a surface hardness of 1300 (HV: Vickers hardness micro-tester, load: 5 g, retention time: 10 seconds). The watch case and watchband had a white coating film formed thereon having high scratch resistance and giving high-quality image similar to stainless steel coating film.

The color evaluation value of the coloring layers were $82<L^*<85$, $0<a^*<2.0$, and $4.0<b^*<5.0$ according to $L^*a^*b^*$ color space (CIE calorimetric system).

Example A9

A watchcase base article and a watchband base article having been prepared from stainless steel (SUS316L) by machining were washed and degreased with an organic solvent. Incidentally the surfaces of the base articles were finished in a hairline pattern by machining.

The base articles were set in an ion plating apparatus, and the surfaces of the base articles were cleaned by bombardment in an argon atmosphere.

On the respective surfaces of the base articles, a titanium carbide plating film (underlayer) which has a concentration gradient structure of carbon content of 5-15 atom % was formed in a thickness of 0.05 μm by ion plating (hot cathode method) under the film formation conditions below.

| < Film Formation Conditions > | |
|---|---|
| Evaporation source: | Titanium |
| Electron gun: | 10 kV, 200-500 mA |
| Gas: | Argon-methane gas mixture |
| Film formation pressure: | 0.004-0.009 Pa |
| Acceleration voltage (bias voltage): | Ground to −100 V |
| Anode voltage: | 50 V |
| Filament voltage: | 7 V |

On the respective surfaces of the titanium carbide plating films formed as the underlayer on the base article surfaces, a white titanium carbide plating film (abrasion-resistant layer) containing carbon at a content of 40±10 atom % was formed in a thickness of 0.6 μm by ion plating (hot cathode method) under the film formation conditions below.

| < Film Formation Conditions > | |
|---|---|
| Evaporation source: | Titanium |
| Electron gun: | 10 kV, 300 mA |
| Gas: | Methane-argon gas mixture |

< Film Formation Conditions >

| | |
|---|---|
| Film formation pressure: | 0.02 Pa |
| Acceleration voltage (bias voltage): | Ground to −100 V |
| Anode voltage: | 60 V |
| Filament voltage: | 7 V |

On the respective plating film surfaces of titanium carbide on the base articles, a white-colored platinum coating film (outermost layer) was formed in a thickness of 0.005 μm by ion plating (hot cathode method) under the conditions below to obtain a watchcase and a watchband of a stainless steel color.

< Film Formation Conditions >

| | |
|---|---|
| Evaporation source: | Platinum |
| Electron gun: | 10 kV, 500 mA |
| Gas: | Argon gas |
| Film formation pressure: | 0.2 Pa |
| Acceleration voltage (bias voltage): | Ground to −50 V |
| Anode voltage: | 60 V |
| Filament voltage: | 7 V |

The platinum coating films formed as above on the surfaces of the watchcase and the watchband had a surface hardness of 1200 (HV: Vickers hardness micro-tester, load: 5 g, retention time: 10 seconds). The watch case and watchband had a white coating film formed thereon having high scratch resistance and giving high-quality image similar to stainless steel coating film.

The color evaluation values of the coloring layers were $82<L^*<85$, $0<a^*<2.0$, and $4.0<b^*<5.0$ according to $L^*a^*b^*$ color space (CIE colorimetric system).

The watchcase and the watchband obtained above, and the watchcase and the watchband obtained in Example A3 were tested for scratching resistance to compare the adhesion of the film to the base article. A surface tester, HEIDON (model 14) was used for the scratching test.

An ornament part sample of Example A3 was prepared which had an underlayer constituted of a titanium plating film and a white-colored titanium carbide plating film (abrasion-resistant layer) containing carbon at a content of 40±10 atom %. Separately, another ornament part sample of Example A9 was prepared which had an underlayer constituted of a titanium carbide plating film containing carbon at a content of 5-15 atom % and a white-colored titanium carbide plating film (abrasion-resistant layer) containing carbon at a content of 40±10 atom %. These ornament part samples were measured for adhesion of the coating film (the critical load, mentioned later).

In the measurement, a diamond indenter was employed which had a tip angle of 90° and tip curvature radius of 50 μm; the scratching rate was 30 mm/minute; and the scratching load was varied from 50 gf to 300 gf at load intervals of 50 gf.

As the results of the measurement test, the scratching resistance varies rapidly at a scratching load of a certain level in view of the scratching load and the resistance after the scratching. Presumably this is due to the fact that the scratching resistance increases linearly with increase of the load to a critical load, and at the load exceeding the critical load, the coating film formed on the base article comes to be cracked, and peeled by chipping. The resulting cracks and peeling by chipping increase abruptly the scratching resistance, causing increase of the friction coefficient. The adhesion of the coating film to the base article can be evaluated by this critical load. At the point where the scratching resistance changed abruptly, the surface state was observed by optical microscopy to evaluate the adhesion strength.

The sample of Example A3 caused chipping-peeling at the scratching load of 200 gf, whereas the sample of Example A9 caused chipping-peeling at the scratching load of 250 gf. That is, the critical load was 200 gf in Example A3, and 250 gf in Example A9. This means that the adhesion of the coating film of the ornament part of Example A9 is higher by 25% than that of Example A3.

In the above Examples A1-A9, naturally, the ornament base article may be made from tungsten carbide; the underlayer may be constituted by a plating film formed from chromium, hafnium, vanadium, or niobium; the abrasion-resistant layer may be constituted of a plating film formed from hafnium carbide, vanadium carbide, niobium carbide, or tungsten carbide; and the outermost layer may be a rhodium coating film, a rhodium alloy coating film, a palladium alloy coating film, or a platinum alloy coating film. In Examples A1-A9, watchcases and watchbands were produced. However, the technique of Examples A1-A9 is naturally applicable to other ornament such as necklaces, pendants, and brooches.

Example B1

A watchcase base article, and a watchband base article, both having been prepared from stainless steel (SUS316L) by machining and surface-finished in a hairline pattern, were washed and degreased with an organic solvent.

The base articles were set in an ion plating apparatus, and the surfaces of the base articles were cleaned by bombardment in an argon atmosphere.

Then on the surfaces of the base articles, a titanium plating film (underlayer) was formed in a thickness of 0.05 μm by ion plating (hot cathode method) under the film formation conditions below.

< Film Formation Conditions >

| | |
|---|---|
| Evaporation source: | Titanium |
| Electron gun: | 10 kV, 200-500 mA |
| Gas: | Argon gas |
| Film formation pressure: | 0.004-0.009 Pa |
| Acceleration voltage (bias voltage): | Ground to −100 V |
| Anode voltage: | 50 V |
| Filament voltage: | 7 V |

On the respective surfaces of the titanium plating films formed on the base articles, a white titanium carbide plating film (abrasion-resistant layer) was formed in a thickness of 0.6 μm by ion plating (hot cathode method) under the film formation conditions below.

< Film Formation Conditions >

| | |
|---|---|
| Evaporation source: | Titanium |
| Electron gun: | 10 kV, 300 mA |
| Gas: | Methane gas |
| Film formation pressure | 0.02 Pa |

-continued

< Film Formation Conditions >

| | |
|---|---|
| Acceleration voltage (bias voltage): | Ground to −100 V |
| Anode voltage: | 60 V |
| Filament voltage: | 7 V |

On the respective surfaces of the plated titanium carbide films formed on the base articles, a white-colored mixture plating film (mixture layer) of titanium carbide and platinum was formed in a thickness of 0.05 μm by ion plating (hot cathode method) under the film formation conditions below.

< Film Formation Conditions >

| | |
|---|---|
| Evaporation source: | Titanium, platinum |
| Electron gun: | 10 kV, |
| | 300 mA (source: titanium) |
| | 10 kV, |
| | 500 mA (source: platinum) |
| Gas: | Methane gas |
| Film formation pressure: | 0.02 Pa |
| Acceleration voltage (bias voltage): | Ground to −50 V |
| Anode voltage: | 60 V |
| Filament voltage: | 7 V |

On the respective surfaces of the mixture-plating films of titanium carbide and platinum on the base articles, a white-colored platinum coating film (outermost layer) was formed in a thickness of 0.005 μm by ion plating (hot cathode method) under the conditions below to obtain a watchcase and a watchband of a stainless steel color.

< Film Formation Conditions >

| | |
|---|---|
| Evaporation source: | Platinum |
| Electron gun: | 10 kV, |
| | 500 mA |
| Gas: | Argon gas |
| Film formation pressure: | 0.2 Pa |
| Acceleration voltage (bias voltage): | Ground to −50 V |
| Anode voltage: | 60 V |
| Filament voltage: | 7 V |

The platinum coating films formed as above on the surfaces of the watchcase and the watchband had a surface hardness of 1400 (HV: Vickers hardness micro-tester, load: 5 g, retention time: 10 seconds). The watchcase and the watchband had a white coating film formed thereon having high scratch resistance and giving high-quality image similar to stainless steel coating film.

The color evaluation values of the coloring layers according to L*a*b* color space (CIE calorimetric system) were 75<L*<85, 0<a*<2.0, and 3.5<b*<5.0.

Example B2

A watchcase base article, and a watchband base article, both having been prepared from titanium by machining and honing-finished, were washed and degreased with an organic solvent.

The base articles were set in a sputtering apparatus, and the surfaces of the base articles were cleaned by bombardment in an argon atmosphere.

On the surfaces of the base articles, a zirconium plating film (underlayer) was formed in a thickness of 0.05 μm by sputtering. (magnetron sputtering system) under the film formation conditions below.

< Film Formation Conditions >

| | |
|---|---|
| Target: | Zirconium |
| Sputtering gas: | Argon gas |
| Film formation pressure: | 0.5 Pa |
| Power applied to target: | 0.5 kW |

Bias voltage (acceleration voltage): −50 V

On the respective surfaces of the zirconium plating films formed on the base articles, a white-colored zirconium carbide coating film (abrasion-resistant layer) was formed in a thickness of 0.6 μm by sputtering (magnetron sputtering system)-under the conditions below.

< Film Formation Conditions >

| | |
|---|---|
| Target: | Zirconium |
| Sputtering gas: | Methane gas |
| Film formation pressure: | 0.665 Pa |
| Power applied to target: | 0.5 kW |
| Bias voltage (acceleration voltage): | −50 V |

Finally, on the surfaces of the zirconium carbide plating films formed on the base articles, a white-colored platinum coating film (outermost layer) was formed in a thickness of 0.005 μm by sputtering (magnetron sputtering system) under the conditions below to obtain a watchcase and a watchband of a stainless steel color.

< Film Formation Conditions >

| | |
|---|---|
| Target: | Platinum |
| Sputtering gas: | Argon gas |
| Film formation pressure: | 0.2 Pa |
| Power applied to target: | 0.5 kW |
| Bias voltage (acceleration voltage): | −50 V |

The platinum coating films formed as above on the surfaces of the watchcase and watchband had a surface hardness of 1300 (HV: Vickers hardness micro-tester, load: 5 g, retention time: 10 seconds). The watchcase and watchband had a white coating film having high scratch resistance and giving high-quality image similar to stainless steel coating film.

The color evaluation values of the coloring layers were 70<L*<82, 0<a*<2.0, and 3.0<b*<4.5 according to L*a*b* color space (CIE calorimetric system).

Example B3

A watchcase base article and a watchband base article having been prepared from brass (copper alloy) by machining were washed and degreased with an organic solvent. Incidentally the surfaces of the base articles had been finished in two ways in a mirror state and a hairline pattern.

The above base articles were immersed in a plating solution having the composition below, and electrically plated under the plating conditions below to form a copper-tin alloy plating film (underlayer 1) in a thickness of 2 μm on the base article surfaces. The formed plating films were washed with water.

<< Copper-Tin Plating >>

< Composition of Plating Solution >

| | |
|---|---|
| Copper cyanide | 15 g/L (in terms of copper) |
| Sodium stannate | 15 g/L (in terms of tin) |
| Zinc cyanide | 1 g/L (in terms of zinc) |
| KOH | 20 g/L |
| KCN (free) | 30 g/L |
| Brightener | 10 mL/L |

< Plating Conditions >

| | |
|---|---|
| PH | 12.5 (at 50° C.) |
| Solution temperature | 50° C. |
| Current density (Dk) | 2 A/dm$^2$ |
| Film formation rate | 3 min/1 μm |

The above base articles coated with the copper-tin alloy plating film were immersed in a plating solution having the composition below, and electrically plated under the plating conditions below to form a copper-tin-zinc alloy plating film (underlayer 2) in a thickness of 2 μm on the respective copper-tin alloy plating film surfaces. The formed plating films were washed with water.

<< Copper-Tin-Zinc Alloy Plating >>

< Composition of Plating Solution >

| | |
|---|---|
| Copper cyanide | 8.5 g/L (in terms of copper) |
| Sodium stannate | 34.0 g/L (in terms of tin) |
| Zinc cyanide | 1 g/L (in terms of zinc) |
| KOH | 20 g/L |
| KCN (free) | 50 g/L |
| Brightener 1 | 5 mL/L |
| Brightener 2 | 5 mL/L |

< Plating Conditions >

| | |
|---|---|
| pH | 13.0 (at 50° C.) |
| Solution temperature | 60° C. |
| Current density (Dk) | 2 A/dm$^2$ |
| Film formation rate | 3 min/1 μm |

The above base articles coated with the copper-tin-zinc alloy plating film were immersed in a plating solution having the composition below, and electrically plated under the plating conditions below to form a palladium strike plating film (underlayer 3) in a thickness of 0.5 μm on the copper-tin-zinc plating film surfaces. The formed plating film was washed with water.

<< Palladium Strike Plating >>

< Composition of Plating Solution >

| | |
|---|---|
| Pure palladium | 1-3 g/L |

< Plating Conditions >

| | |
|---|---|
| pH | 8 |
| Solution temperature | 32° C. |
| Current density (Dk) | 3-5 A/dm$^2$ |
| Time | 30 seconds |

The base articles were set in a sputtering apparatus, and the surfaces of the base articles were cleaned by bombardment in an argon atmosphere.

On the palladium strike plated coating surfaces, a tantalum coating film (underlayer 4) was formed in a thickness of 0.05 μm by sputtering (magnetron sputtering system) under the film formation conditions below.

<Film Formation Conditions>

| | |
|---|---|
| Target: | Tantalum |
| Sputtering gas: | Argon gas |
| Film formation pressure: | 0.4 Pa |
| Power applied to target: | 0.5 kW |
| Bias voltage (acceleration voltage): | −50 V |

On the respective tantalum plating film surfaces formed on the base articles, a white-colored tantalum carbide coating film (abrasion-resistant layer) was formed in a thickness of 0.6 μm by sputtering (magnetron sputtering system) under the conditions below.

<Film Formation Conditions>

| | |
|---|---|
| Target: | Tantalum |
| Sputtering gas: | Methane-argon gas mixture |
| Film formation pressure: | 0.665 Pa |
| Power applied to target: | 0.5 kW |
| Bias voltage (acceleration voltage): | −50 V |

Finally, on the tantalum carbide plating film surfaces formed on the base articles, a white-colored palladium coating film (outermost layer) was formed in a thickness of 0.005 μm by sputtering (magnetron sputtering system) under the conditions below to obtain a watchcase and a watchband of a stainless steel color.

<Film Formation Conditions>

| | |
|---|---|
| Target: | Palladium |
| Sputtering gas: | Argon gas |
| Film formation pressure: | 0.4 Pa |
| Power applied to target: | 0.5 kW |
| Bias voltage (acceleration voltage): | −50 V |

The palladium coating films formed as above on the surfaces of the watchcase and watchband had a surface hardness of 1300 (HV: Vickers hardness micro-tester, load: 5 g, retention time: 10 seconds). The watch case and watchband had a white coating film having high scratch resistance and giving high-quality image similar to stainless steel coating film.

The color evaluation values of the coloring layers were 75<$L^*$<90, 0<$a^*$<2.0, and 3.5<$b^*$<5.0 according to $L^*a^*b^*$ color space (CIE calorimetric system).

Example B4

A watchcase base article and a watchband base article having been prepared from stainless steel (SUS316L) by machining and surface-finished in a mirror state had been washed and degreased with an organic solvent.

The base articles were set in an ion plating apparatus, and the surfaces of the base articles were cleaned by bombardment in an argon atmosphere.

On the respective surfaces of the base articles, a titanium plating film (underlayer) was formed in a thickness of 0.05 μm by ion plating (hot cathode method) under the film formation conditions below.

| <Film Formation Conditions> | |
|---|---|
| Evaporation source: | Titanium |
| Electron gun: | 10 kV, 200-500 mA |
| Gas: | Argon gas |
| Film formation pressure: | 0.004-0.009 Pa |
| Acceleration voltage (bias voltage): | Ground to −100 V |
| Anode voltage: | 50 V |
| Filament voltage: | 7 V |

On the respective surfaces of the titanium plating films formed on the base articles, a white titanium carbide plating film (abrasion-resistant layer) was formed in a thickness of 0.6 μm by ion plating (hot cathode method) under the film formation conditions below.

| <Film Formation Conditions> | |
|---|---|
| Evaporation source: | Titanium |
| Electron gun: | 10 kV, 300 mA |
| Gas: | Methane-argon gas mixture |
| Film formation pressure: | 0.02 Pa |
| Acceleration voltage (bias voltage): | Ground to −100 V |
| Anode voltage: | 60 V |
| Filament voltage: | 7 V |

On the respective surfaces of the plating films of titanium carbide films formed on the base articles, a white-colored platinum coating film (outermost layer) was formed in a thickness of 0.005 μm by ion plating (hot cathode method) under the conditions below to obtain a watchcase and a watchband of a stainless steel color.

| <Film Formation Conditions> | |
|---|---|
| Evaporation source: | Platinum |
| Electron gun: | 10 kV, 500 mA |
| Gas: | Argon gas |
| Film formation pressure: | 0.2 Pa |
| Acceleration voltage (bias voltage): | Ground to −50 V |
| Anode voltage: | 60 V |
| Filament voltage: | 7 V |

The platinum coating films formed as above on the surfaces of the watchcase and watchband had a surface hardness of 1200 (HV: Vickers hardness micro-tester, load: 5 g, retention time: 10 seconds). The watchcase and watchband had a white coating film formed thereon having high scratch resistance and giving high-quality image similar to stainless steel coating film.

The color evaluation values of the coloring layers were $85<L^*<90$, $0<a^*<2.0$, and $4.0<b^*<5.0$ according to $L^*a^*b^*$ color space (CIE calorimetric system).

Example B5

On a part of the surfaces of hard films of a stainless steel color (platinum coating films) formed in the same manner as in Example B4, a plating film having a color different from the color of the hard film (differential coloring film) was formed by dry-plating.

Specifically, on the hard coating film surfaces, a titanium plating film was formed in a thickness of 0.05 μm by ion plating (hot cathode method) under the film formation conditions below.

| <Film Formation Conditions> | |
|---|---|
| Evaporation source: | Titanium |
| Electron gun: | 10 kV, 200-500 mA |
| Gas: | Argon gas |
| Film formation pressure: | 0.2 Pa |
| Acceleration voltage (bias voltage): | Ground to −100 V |
| Anode voltage: | 40-50 V |
| Filament voltage: | 7 V |

On the surface of the titanium plating film, a titanium nitride plating film giving a golden color was formed in a thickness of 0.6 μm by ion plating (hot cathode method) under the film formation conditions below.

| <Film Formation Conditions> | |
|---|---|
| Evaporation source: | Titanium |
| Electron gun: | 10 kV, 200-500 mA |
| Gas: | Argon-nitrogen gas mixture |
| Film formation pressure: | 0.2 Pa |
| Acceleration voltage (bias voltage): | Ground to −100 V |
| Anode voltage: | 40-50 V |
| Filament voltage: | 7 V |

On the surface of the titanium nitride plating film, a gold-iron alloy plating film giving a golden color was formed in a thickness of 0.1 μm by ion plating (hot cathode method) under the film formation conditions below.

| <Film Formation Conditions> | |
|---|---|
| Evaporation source: | Gold-iron alloy |
| Electron gun: | 8 kV, 500 mA |
| Gas: | Argon gas |
| Film formation pressure: | 0.26 Pa |
| Acceleration voltage (bias voltage): | Ground to −100 V |
| Anode voltage: | 10-30 V |
| Filament voltage: | 7 V |

A part of the gold-iron alloy plating film was treated for masking (with an epoxy resist as the masking material). The gold-iron alloy plating film, the titanium nitride plating film, and the titanium plating film were removed successively by etching solutions. Finally, the mask was removed. Thereby, a watchcase and a watchband were obtained which had an outermost two-tone coating film having a hard stainless steel-colored coating film and a gold-colored gold-iron alloy plating film.

The etching solution (peeling liquid) employed for removal of the gold-iron alloy plating film was a solution containing a cyanide compound as the main component and additionally an oxidant. The etching solution for the titanium nitride plating film and for titanium plating film was a solution containing nitric acid as the main component and additionally ammonium fluoride. The mask-peeling liquid employed was methylene chloride.

The platinum coating films formed as above on the surfaces of the watchcase and the watchband had a surface hardness of 1200 (HV: Vickers hardness micro-tester, load: 5 g, retention time: 10 seconds), and the gold-iron alloy plating film had a surface hardness of 120 (HV: Vickers hardness micro-tester, load: 5 g, retention time: 10 seconds). The watchcase and watchband had a white coating film formed thereon having high scratch resistance and giving high-quality image similar to stainless steel coating film.

The color evaluation of outermost layers (white coating films) constituting the coloring layers were $85<L^*<90$, $0<a^*<2.0$, and $4.0<b^*<5.0$ according to $L^*a^*b^*$ color space (CIE colorimetric system).

Example B6

On a part of the surfaces of hard films of a stainless steel color (platinum coating films) formed in the same manner as in Example B4, a plating film having a color different from the color of the hard film (differential coloring film) was formed by wet-plating.

Specifically, the base articles having the hard coating film formed thereon were subjected to pretreatment of electrolytic degreasing, neutralization and water washing for cleaning.

These hard film-coated base articles were electroplated in a plating solution having the composition below under the electroplating conditions below. Thereby a gold strike-plating film was formed in a thickness of 0.1 μm on the hard coating film surface. The films were washed with water.

| <<Gold Strike Plating>> | |
| --- | --- |
| <Composition of Plating Solution> | |
| Gold | 3-5 g/L |
| Sulfuric acid | 10 g/L |
| <Plating Conditions> | |
| pH | $0.3 \leq pH < 1$ |
| Solution temperature | 25° C. |
| Current density (Dk) | 3-5 A/dm$^2$ |
| Time | 30 seconds |

This base article having the gold strike-plating film was electroplated in the plating solution having the composition below under the electroplating conditions below. Thereby a gold-iron alloy plating film was formed in a thickness of 2.0 μm on the gold strike plating film surfaces. The formed films were washed with water.

| <<Gold-Iron Alloy Plating>> | |
| --- | --- |
| <Composition of Plating Solution> | |
| Potassium cyanide | 8.7 g/L (Metal 5.0 g/L) |
| Iron chloride | 2.7 g/L (Metal 1.0 g/L) |
| Citric acid | 150 g/L or more |
| Sodium citrate | 150 g/L or more |
| Brightener | 10 mL/L |
| <Plating Conditions> | |
| pH | 3.5-3.7 |
| Bath temperature | 37-40° C. |
| Current density (Dk) | 1.0-1.5 A/dm$^2$ |
| Be (Baumé specific gravity) | 20 |

The gold-iron alloy plating film was locally treated for masking. The gold-iron alloy plating film, and the gold strike-plating film were removed successively by etching solutions. Finally, the mask was removed. Thereby, a watchcase and a watchband were obtained which had an outermost two-tone coating film having a stainless steel-color hard coating film and a gold-color gold-iron alloy plating film.

The etching solution (peeling liquid) employed for removal of the gold-iron alloy plating film and removal of gold strike plating film was a solution containing a cyanide compound as the main component and additionally an oxidant. The mask-peeling liquid employed was methylene chloride.

The platinum coating films formed as above on the surfaces of the watchcase and the watchband had a surface hardness of 1100 (HV: Vickers hardness micro-tester, load: 5 g, retention time: 10 seconds), and the gold-iron alloy plating film had a surface hardness of 120 (HV: Vickers micro-hardness tester, load: 5 g, retention time: 10 seconds). The watchcase and the watchband had a white coating film formed thereon having high scratch resistance and giving high-quality image similar to stainless steel coating film.

The color evaluation values of the outermost layers (white coating films) constituting the coloring layers were $82<L^*<85$, $0<a^*<2.0$, and $4.0<b^*<5.0$ according to $L^*a^*b^*$ color space (CIE calorimetric system).

Example B7

On a part of the surfaces of hard films of a stainless steel color (platinum coating films) formed in the same manner as in Example B4, a plating film having a color different from the color of the hard film (differential coloring layer) was formed by dry-plating.

Specifically, a masking material (an epoxy resist) was applied onto a part of the surfaces of the hard films, and was dried. On the hard film surfaces and the mask material surfaces, a titanium plating film was formed in a thickness of 0.05 μm by sputtering (magnetron sputtering system) under the film formation conditions below.

| <Film Formation Conditions> | |
| --- | --- |
| Target: | Titanium |
| Sputtering gas: | Argon gas |
| Film formation pressure: | 0.02 Pa |
| Power applied to target: | 0.3-0.5 kW |
| Bias voltage (acceleration voltage): | −50 to −100 V |

On the titanium plating film surfaces, a silicon plating film was formed in a thickness of 0.1 μm by sputtering (magnetron sputtering system) under the film formation conditions below.

| <Film Formation Conditions> | |
| --- | --- |
| Target: | Silicon |
| Sputtering gas: | Argon gas |
| Film formation pressure: | 0.05 Pa |
| Power applied to target: | 0.3-0.5 kW |
| Bias voltage (acceleration voltage): | −50 to −100 V |

Then, on the silicon plating film surfaces, a black diamond-like carbon (DLC) plating film was formed in a thickness of 0.1 μm by plasma CVD (chemical vapor deposition) under the film formation conditions below.

<Film Formation Conditions>

| | |
|---|---|
| Gas: | Benzene |
| Film formation pressure: | 0.2 Pa |
| Filament current: | 20 A |
| Anode current: | 2.0 A |
| Cathode voltage (acceleration voltage): | −1.0 to −5.0 kV |

Finally, the masking material was etched by methylene chloride to lift off the titanium plating films, silicon plating films and DCL plating films formed just on the masks. As the result, a watchcase and a watchband were obtained which have respectively an outermost two-tone coating film.

The platinum coating films formed as above on the surfaces of the watchcase and watchband had a surface hardness of 1200 (HV: Vickers hardness micro-tester, load: 5 g, retention time: 10 seconds), and the DLC plating films had a surface hardness of 1800 (HV: Vickers hardness micro-tester, load: 5 g, retention time: 10 seconds) The watchcase and the watchband had a white coating film having high scratch resistance and giving high-quality image similar to stainless steel coating film.

The color evaluation values of the outermost layers (white coating films) constituting the coloring layer were $85<L^*<90$, $0<a^*<2.0$, and $4.0<b^*<5.0$ according to $L^*a^*b^*$ color space (CIE colorimetric system).

Example B8

A watchcase base article and a watchband base article having been prepared by molding a zirconia ceramic in a shape of a watchcase and a watchband were washed and degreased with an organic solvent. (The method of preparing such a base article such as a watchcase is described specifically in the specification of Japanese Patent Application No. 2001-333236 (filed on Oct. 30, 2001 (Paragraphs: [0032]-[0036]) by inventors of the present invention). Incidentally the surfaces of the base articles had been finished in a mirror surface state.

The base articles were set in an ion plating apparatus, and the surfaces of the base articles were cleaned by bombardment in an argon atmosphere.

On the respective surfaces of the base articles, a chromium plating film (underlayer) was formed in a thickness of 0.05 μm by ion plating (hot cathode method) under the film formation conditions below.

<Film Formation Conditions>

| | |
|---|---|
| Evaporation source: | Chromium |
| Electron gun: | 10 kV, 300 mA |
| Gas: | Argon gas |
| Film formation pressure: | 0.004-0.009 Pa |
| Acceleration voltage (bias voltage): | Ground to −100 V |
| Anode voltage: | 60 V |
| Filament voltage: | 7 V |

On the respective surfaces of the chromium plating films formed on the base articles, a white chromium carbide plating film (abrasion-resistant layer) was formed in a thickness of 0.6 μm by ion plating (hot cathode method) under the film formation conditions below.

<Film Formation Conditions>

| | |
|---|---|
| Evaporation source: | Chromium |
| Electron gun: | 10 kV, 300 mA |
| Gas: | Methane-argon gas mixture |
| Film formation pressure: | 0.02 Pa |
| Acceleration voltage (bias voltage): | Ground to −100 V |
| Anode voltage: | 60 V |
| Filament voltage: | 7 V |

On the respective surfaces of the plating films of chromium carbide on the base articles, a white-colored palladium coating film (outermost layer) was formed in a thickness of 0.005 μm by ion plating (hot cathode method) under the conditions below to obtain a watchcase and a watchband of a stainless steel color.

<Film Formation Conditions>

| | |
|---|---|
| Evaporation source: | Palladium |
| Electron gun: | 10 kV, 500 mA |
| Gas: | Argon gas |
| Film formation pressure: | 0.2 Pa |
| Acceleration voltage (bias voltage): | Ground to −50 V |
| Anode voltage: | 60 V |
| Filament voltage: | 7 V |

The palladium coating films formed as above on the surfaces of the watchcase and the watchband had a surface hardness of 1300 (HV: Vickers hardness micro-tester, load: 5 g, retention time: 10 seconds). The watch case and watchband had a white coating film formed thereon having high scratch resistance and giving high-quality image similar to stainless steel coating film.

The color evaluation value of the coloring layers were $85<L^*<90$, $0<a^*<2.0$, and $4.0<b^*<5.0$ according to $L^*a^*b^*$ color space (CIE calorimetric system).

Example B9

A watchcase base article and a watchband base article having been prepared from stainless steel (SUS316L) by machining, both having been mirror-finished, were washed and degreased with an organic solvent. Incidentally the surfaces of the base articles were finished in a hairline pattern by machining.

The base articles were set in an ion plating apparatus, and the surfaces of the base articles were cleaned by bombardment in an argon atmosphere.

On the respective surfaces of the base articles, a titanium carbide plating film (underlayer) which has a concentration gradient structure of carbon content of 5-15 atom % was formed in a thickness of 0.05 μm by ion plating (hot cathode method) under the film formation conditions below.

<Film Formation Conditions>

| | |
|---|---|
| Evaporation source: | Titanium |
| Electron gun: | 10 kV, 200-500 mA |
| Gas: | Argon-methane gas mixture |
| Film formation pressure: | 0.004-0.009 Pa |
| Acceleration voltage (bias voltage): | Ground to −100 V |
| Anode voltage: | 50 V |
| Filament voltage: | 7 V |

On the respective surfaces of the titanium carbide plating films formed as the underlayer on the base article surfaces, a white titanium carbide plating (abrasion-resistant layer) film containing carbon at a content of 40±10 atom % was formed in a thickness of 0.6 μm by ion plating (hot cathode method) under the film formation conditions below.

<Film Formation Conditions>

| | |
|---|---|
| Evaporation source: | Titanium |
| Electron gun: | 10 kV, 300 mA |
| Gas: | Methane-argon gas mixture |
| Film formation pressure: | 0.02 Pa |
| Acceleration voltage (bias voltage): | Ground to −100 V |
| Anode voltage: | 60 V |
| Filament voltage: | 7 V |

On the respective plating film surfaces of titanium carbide on the base articles, a white-colored platinum coating film (outermost layer) was formed in a thickness of 0.005 μm by ion plating (hot cathode method) under the conditions below to obtain a watchcase and a watchband of a stainless steel color.

<Film Formation Conditions>

| | |
|---|---|
| Evaporation source: | Platinum |
| Electron gun: | 10 kV, 500 mA |
| Gas: | Argon gas |
| Film formation pressure: | 0.2 Pa |
| Acceleration voltage (bias voltage): | Ground to −50 V |
| Anode voltage: | 60 V |
| Filament voltage: | 7 V |

The platinum coating films formed as above on the surfaces of the watchcase and the watchband had a surface hardness of 1200 (HV: Vickers hardness micro-tester, load: 5 g, retention time: 10 seconds). The watch case and watchband had a white coating film formed thereon having high scratch resistance and giving high-quality image similar to stainless steel coating film.

The color evaluation values of the coloring layers were 85<L*<90, 0<a*<2.0, and 4.0<b*<5.0 according to L*a*b* color space (CIE calorimetric system).

The watchcase and the watchband obtained above, and the watchcase and the watchband obtained in Example B4 were tested for scratching resistance to compare the adhesion of the film to the base article in the same manner as in Example A9.

An ornament part sample of Example B4 was prepared which had an underlayer constituted of a titanium plating film and a white-colored titanium carbide plating film (abrasion-resistant layer) containing carbon at a content of 40±10 atom %. Separately, another ornament part sample of Example B9 was prepared which had an underlayer constituted of a titanium carbide plating film containing carbon at a content of 5-15 atom % and a white-colored titanium carbide plating film (abrasion-resistant layer) containing carbon at a content of 40±10 atom %. These ornament part samples were measured for adhesion of the coating film (critical load).

The sample of Example B4 caused chipping-peeling at the scratching load of 200 gf, whereas the sample of Example B9 caused chipping-peeling at the scratching load of 250 gf. That is, the critical load was 200 gf in Example B4, and 250 gf in Example B9. This means that the adhesion of the coating film of the ornament part of Example B9 is higher by 25% than that of Example B4.

In the above Examples B1-B9, naturally, the ornament base article may be made from tungsten carbide; the underlayer may be constituted by a plating film formed from chromium, hafnium, vanadium, or niobium; the abrasion-resistant layer may be constituted of a plating film formed from hafnium carbide, vanadium carbide, niobium carbide, or tungsten carbide; and the outermost layer may be a rhodium coating film, a rhodium alloy coating film, a palladium alloy coating film, or a platinum alloy coating film. In Examples B1-B9, watchcases and watchbands were produced. However, the technique of Examples B1-B9 is naturally applicable to other ornament such as necklaces, pendants, and brooches.

Example C1

A watchcase base article and a watchband base article having been prepared from stainless steel (SUS316L) by machining were washed and degreased with an organic solvent. Incidentally the surfaces of the base articles had been mirror-finished by machining.

The base articles were set in an ion plating apparatus, and the surfaces of the base articles were cleaned by bombardment in an argon atmosphere.

Then on the surfaces of the base articles, a titanium plating film (underlayer) was formed in a thickness of 0.05 μm by ion plating (hot cathode method) under the film formation conditions below.

< Film Formation Conditions >

| | |
|---|---|
| Evaporation source: | Titanium |
| Electron gun: | 10 kV, 200-500 mA |
| Gas: | Argon gas |
| Film formation pressure: | 0.004-0.009 Pa |
| Acceleration voltage (bias voltage): | Ground to −100 V |
| Anode voltage: | 50 V |
| Filament voltage: | 7 V |

On the respective surfaces of the titanium plating films formed on the base articles, a white titanium carbide plating film (titanium carbide layer) was formed in a thickness of 0.6 μm by ion plating (hot cathode method) under the film formation conditions below.

< Film Formation Conditions >

| | |
|---|---|
| Evaporation source: | Titanium |
| Electron gun: | 10 kV, 300 mA |
| Gas: | Methane gas |
| Film formation pressure: | 0.02 Pa |
| Acceleration voltage (bias voltage): | Ground to −100 V |
| Anode voltage: | 60 V |
| Filament voltage: | 7 V |

On the respective surfaces of the plated titanium carbide films formed on the base articles, a white-colored mixture plating film (mixture layer) of titanium carbide and platinum was formed in a thickness of 0.02 μm by ion plating (hot cathode method) under the film formation conditions below.

| < Film Formation Conditions > | |
|---|---|
| Evaporation source: | Titanium, platinum |
| Electron gun: | 10 kV, 300 mA (source: titanium) 10 kV, 500 mA (source: platinum) |
| Gas: | Methane gas |
| Film formation pressure: | 0.02 Pa |
| Acceleration voltage (bias voltage): | Ground to −50 V |
| Anode voltage: | 60 V |
| Filament voltage: | 7 V |

On the respective surfaces of the mixture-plating films of titanium carbide and platinum on the base articles, a white-colored platinum coating film (ornamental coating layer) was formed in a thickness of 0.05 μm by ion plating (hot cathode method) under the conditions below to obtain a watchcase and a watchband of a platinum color.

| < Film Formation Conditions > | |
|---|---|
| Evaporation source: | Platinum |
| Electron gun: | 10 kV, 500 mA |
| Gas: | Argon gas |
| Film formation pressure: | 0.2 Pa |
| Acceleration voltage (bias voltage): | Ground to −50 V |
| Anode voltage: | 60 V |
| Filament voltage: | 7 V |

The platinum coating films formed as above on the surfaces of the watchcase and the watchband had a surface hardness of 1400 (Hv: Vickers hardness micro-tester, load: 5 g, retention time: 10 seconds). The watchcase and the watchband had a white coating film formed thereon having high scratch resistance and giving superior quality of a platinum color tone.

The color evaluation values of the ornamental coating layers (white coating films) were $88<L^*<92$, $1.8<a^*<2.5$, and $5.0<b^*<5.5$ according to $L^*a^*b^*$ color space (CIE calorimetric system).

Example C2

A watchcase base article and a watchband base article as personal ornaments having been prepared from titanium by machining were washed and degreased with an organic solvent. Incidentally the surfaces of the base articles had been mirror-finished by machining.

The base articles were set in a sputtering apparatus, and the surfaces of the base articles were cleaned by bombardment in an argon atmosphere.

On the surfaces of the base articles, a zirconium plating film (underlayer) was formed in a thickness of 0.05 μm by sputtering (magnetron sputtering system) under the film formation conditions below.

| < Film Formation Conditions > | |
|---|---|
| Target: | Zirconium |
| Sputtering gas: | Argon gas |
| Film formation pressure: | 0.5 Pa |

-continued

| < Film Formation Conditions > | |
|---|---|
| Power applied to target: | 0.5 kW |
| Bias voltage (acceleration voltage): | −50 V |

On the respective surfaces of the zirconium plating films formed on the base articles, a white-colored titanium carbide coating film (titanium carbide layer) was formed in a thickness of 0.6 μm by sputtering (magnetron sputtering system) under the conditions below.

| < Film Formation Conditions > | |
|---|---|
| Target: | Titanium |
| Sputtering gas: | Methane gas |
| Film formation pressure: | 0.6 Pa |
| Power applied to target: | 0.5 kW |
| Bias voltage (acceleration voltage): | −50 V |

Then on the respective surfaces of the titanium carbide plating films formed on the base articles, a white-colored stainless steel plating film (stainless steel coating layer) was formed in a thickness of 0.2 μm by sputtering (magnetron sputtering system) under the conditions below.

| < Film Formation Conditions > | |
|---|---|
| Target: | Austenitic stainless steel SUS304 |
| Sputtering gas: | Argon gas |
| Film formation pressure: | 0.2-0.9 Pa |
| Power applied to target: | 0.4-0.5 kW |
| Bias voltage (acceleration voltage): | Ground to −300 V |

Finally, on the surfaces of the stainless steel plating films formed on the base articles, a white-colored platinum coating film (ornamental coating layer) was formed in a thickness of 0.05 μm by sputtering (magnetron sputtering system) under the conditions below to obtain a watchcase and a watchband of a platinum color.

| < Film Formation Conditions > | |
|---|---|
| Target: | Platinum |
| Sputtering gas: | Argon gas |
| Film formation pressure: | 0.2 Pa |
| Power applied to target: | 0.5 kW |
| Bias voltage (acceleration voltage): | −50 V |

The platinum coating films formed as above on the surfaces of the watchcase and watchband had a surface hardness of 1300 (Hv: Vickers hardness micro-tester, load: 5 g, retention time: 10 seconds). The watchcase and watchband had a white coating film having high scratch resistance and giving superior quality of a platinum color.

The color evaluation values of the ornamental coating layers (white coating films) were 88<$L^*$<92, 1.8<$a^*$<2.5, and 5.0<$b^*$<5.5 according to $L^*a^*b^*$ color space (CIE calorimetric system).

Example C3

A watchcase base article and a watchband base article as personal ornaments having been prepared from brass (copper alloy) by machining were washed and degreased with an organic solvent. Incidentally the surfaces of the base articles had been mirror-finished by machining.

The above base articles were immersed in a plating solution having the composition below, and electrically plated under the plating conditions below to form a copper-tin alloy plating film (underlayer 1) in a thickness of 2 μm on the base article surfaces. The formed plating films were washed with water.

| << Copper-Tin Plating >> | |
|---|---|
| < Composition of Plating Solution > | |
| Copper cyanide | 15 g/L (in terms of copper) |
| Sodium stannate | 15 g/L (in terms of tin) |
| Zinc cyanide | 1 g/L (in terms of zinc) |
| KOH | 20 g/L |
| KCN (free) | 30 g/L |
| Brightener | 10 mL/L |
| < Plating Conditions > | |
| pH | 12.5 (at 50° C.) |
| Solution temperature | 50° C. |
| Current density (Dk) | 2 A/dm$^2$ |
| Film formation rate | 3 min/1 μm |

The above base articles coated with the copper-tin alloy plating film were immersed in a plating solution having the composition below, and electrically plated under the plating conditions below to form a copper-tin-zinc alloy plating film (underlayer 2) in a thickness of 2 μm on the respective copper-tin alloy plating film surfaces. The formed plating films were washed with water.

| << Copper-Tin-Zinc Alloy Plating >> | |
|---|---|
| < Composition of Plating Solution > | |
| Copper cyanide | 8.5 g/L (in terms of copper) |
| Sodium stannate | 34.0 g/L (in terms of tin) |
| Zinc cyanide | 1 g/L (in terms of zinc) |
| KOH | 20 g/L |
| KCN (free) | 50 g/L |
| Brightener 1 | 5 mL/L |
| Brightener 2 | 5 mL/L |
| < Plating Conditions > | |
| pH | 13.0 (at 50° C.) |
| Solution temperature | 60° C. |
| Current density (Dk) | 2 A/dm$^2$ |
| Film formation rate | 3 min/1 μm |

The above base articles coated with the copper-tin-zinc alloy plating film were immersed in a plating solution having the composition below, and electrically plated under the plating conditions below to form a palladium strike plating film (underlayer 3) in a thickness of 0.5 μm on the copper-tin-zinc plating film surfaces. The formed plating film was washed with water.

| <<Palladium Strike Plating>> | |
|---|---|
| <Composition of Plating Solution> | |
| Pure palladium | 1-3 g/L |
| <Plating Conditions> | |
| pH | 8 |
| Solution temperature | 32° C. |
| Current density (Dk) | 3-5 A/dm$^2$ |
| Time | 30 seconds |

The base articles were set in a sputtering apparatus, and the surfaces of the base articles were cleaned by bombardment in an argon atmosphere.

On the palladium strike plated coating surfaces, a tantalum coating film (underlayer 4) was formed in a thickness of 0.05 μm by sputtering (magnetron sputtering system) under the film formation conditions below.

| <Film Formation Conditions> | |
|---|---|
| Target: | Tantalum |
| Sputtering gas: | Argon gas |
| Film formation pressure: | 0.4 Pa |
| Power applied to target: | 0.5 kW |
| Bias voltage (acceleration voltage): | −50 V |

On the respective tantalum plating film surfaces formed on the base articles, a white-colored titanium carbide plating film (titanium carbide layer) was formed in a thickness of 0.6 μm by sputtering (magnetron sputtering system) under the conditions below.

| <Film Formation Conditions> | |
|---|---|
| Target: | Titanium |
| Sputtering gas: | Methane-argon gas mixture |
| Film formation pressure: | 0.6 Pa |
| Power applied to target: | 0.5 kW |
| Bias voltage (acceleration voltage): | −50 V |

Finally, on the titanium carbide plating film surfaces formed on the base articles, a white-colored platinum alloy coating film (ornamental coating layer) was formed in a thickness of 0.05 μm by sputtering (magnetron sputtering system) under the conditions below to obtain a watchcase and a watchband of a platinum color.

| <Film Formation Conditions> | |
|---|---|
| Target: | Platinum alloy |
| Sputtering gas: | Argon gas |
| Film formation pressure: | 0.6 Pa |
| Power applied to target: | 0.5 kW |
| Bias voltage (acceleration voltage): | −50 V |

The platinum alloy coating films formed as above on the surfaces of the watchcase and watchband had a surface hardness of 1300 (HV: Vickers hardness micro-tester, load: 5 g, retention time: 10 seconds). The watch case and the watchband had a white coating film having high scratch resistance and giving superior quality of a platinum alloy color.

The color evaluation values of the ornamental coating layers (white coating films) were 88<L*<92, 1.8<a*<2.5, and 5.0<b*<5.5 according to L*a*b* color space (CIE calorimetric system).

Example C4

A watchcase base article and a watchband base article as a personal ornament having been prepared by molding a zirconia ceramic in a shape of a watchcase and a watchband were washed and degreased with an organic solvent. (The method of preparing such a base article such as a watchcase is described specifically in the specification of Japanese Patent Application No. 2001-333236 (filed on Oct. 30, 2001 (Paragraphs: [0032]-[0036]) by inventors of the present invention). Incidentally the surfaces of the base articles had been mirror-finished by machining.

The base articles were set in a sputtering apparatus, and the surfaces of the base articles were cleaned by bombardment in an argon atmosphere.

On the surfaces of the base articles, a chromium plating film (underlayer) was formed in a thickness of 0.05 μm by sputtering (magnetron sputtering system) under the film formation conditions below.

| <Film Formation Conditions> | |
|---|---|
| Target: | Chromium |
| Sputtering gas: | Argon gas |
| Film formation pressure: | 0.4 Pa |
| Power applied to target: | 0.5 kW |
| Bias voltage (acceleration voltage): | −50 V |

On the respective surfaces of the chromium plating films formed on the base articles, a white-colored titanium carbide plating film (titanium carbide layer) was formed in a thickness of 0.6 μm by sputtering (magnetron sputtering system) under the conditions below.

| <Film Formation Conditions> | |
|---|---|
| Target: | Titanium |
| Sputtering gas: | Methane gas |
| Film formation pressure: | 0.6 Pa |
| Power applied to target: | 0.5 kW |
| Bias voltage (acceleration voltage): | −50 V |

Then on the respective surfaces of the titanium carbide plating films formed on the base articles, a white-colored stainless steel plating film (stainless steel coating layer) was formed in a thickness of 0.2 μm by sputtering (magnetron sputtering system) under the conditions below.

| <Film Formation Conditions> | |
|---|---|
| Target: | Austenitic stainless steel (SUS304) |
| Sputtering gas: | Argon gas |
| Film formation pressure: | 0.2-0.9 Pa |
| Power applied to target: | 0.4-0.5 kW |
| Bias voltage (acceleration voltage): | Ground to −300 V |

Finally, on the surfaces of the stainless steel plating films formed on the base articles, a white-colored platinum coating film (ornamental coating layer) was formed in a thickness of 0.05 μm by sputtering (magnetron sputtering system) under the conditions below to obtain a watchcase and a watchband of a platinum color.

| <Film Formation Conditions> | |
|---|---|
| Target: | Platinum |
| Sputtering gas: | Argon gas |
| Film formation pressure: | 0.2 Pa |
| Power applied to target: | 0.5 kW |
| Bias voltage (acceleration voltage): | −50 V |

The platinum coating films formed as above on the surfaces of the watchcase and watchband had a surface hardness of 1300 (Hv: Vickers hardness micro-tester, load: 5 g, retention time: 10 seconds). The watchcase and watchband had a white coating film having high scratch resistance and giving superior quality of a platinum color.

The color evaluation values of the ornamental coating layers (white coating films) were 88<L*<92, 1.8<a*<2.5, and 5.0<b*<5.5 according to L*a*b* color space (CIE calorimetric system).

Example C5

A watchcase base article and a watchband base article for personal ornaments having been prepared from stainless steel (SUS316L) by machining were washed and degreased with an organic solvent. Incidentally the surfaces of the base articles had been mirror-finished by machining.

The base articles were set in an ion plating apparatus, and the surfaces of the base articles were cleaned by bombardment in an argon atmosphere.

On the respective surfaces of the base articles, a titanium plating film (underlayer) was formed in a thickness of 0.05 μm by ion plating (hot cathode method) under the film formation conditions below.

| <Film Formation Conditions> | |
|---|---|
| Evaporation source: | Titanium |
| Electron gun: | 10 kV, 200-500 mA |
| Gas: | Argon gas |
| Film formation pressure: | 0.004-0.009 Pa |
| Acceleration voltage (bias voltage): | Ground to −100 V |
| Anode voltage: | 50 V |
| Filament voltage: | 7 V |

On the respective surfaces of the titanium plating films formed on the base articles, a white titanium carbide plating film (abrasion-resistant layer) was formed in a thickness of 0.6 μm by ion plating (hot cathode method) under the film formation conditions below.

| <Film Formation Conditions> | |
|---|---|
| Evaporation source: | Titanium |
| Electron gun: | 10 kV, 300 mA |
| Gas: | Methane-argon gas mixture |
| Film formation pressure: | 0.02 Pa |
| Acceleration voltage (bias voltage): | Ground to −100 V |

-continued

| <Film Formation Conditions> | |
|---|---|
| Anode voltage: | 60 V |
| Filament voltage: | 7 V |

On the respective surfaces of the plating films of titanium carbide films formed on the base articles, was formed a white-colored platinum coating film (ornamental coating layer) in a thickness of 0.05 μm by ion plating (hot cathode method) under the conditions below to obtain a watchcase and a watchband of a stainless steel color.

| < Film Formation Conditions > | |
|---|---|
| Evaporation source: | Platinum |
| Electron gun: | 10 kV, 500 mA |
| Gas: | Argon gas |
| Film formation pressure: | 0.2 Pa |
| Acceleration voltage (bias voltage): | Ground to −50 V |
| Anode voltage: | 60 V |
| Filament voltage: | 7 V |

The platinum coating films formed as above on the surfaces of the watchcase and watchband had a surface hardness of 1200 (HV: Vickers hardness micro-tester, load: 5 g, retention time: 10 seconds). The watchcase and watchband had a white coating film formed thereon having high scratch resistance and giving superior quality of a platinum color.

The color evaluation values of the ornamental coating layers (white coating films) were $88<L^*<92$, $1.8<a^*<2.5$, and $5.0<b^*<5.5$ according to $L^*a^*b^*$ color space (CIE calorimetric system).

Example C6

On a part of the surfaces of a platinum coating film (ornamental coating layer) formed in the same manner as in Example C5, a plating film having a color different from the color of this film (differential coloring film) was formed by dry-plating.

Specifically, on the coating film surfaces, a titanium plating film was formed in a thickness of 0.05 μm by ion plating (hot cathode method) under the film formation conditions below.

| < Film Formation Conditions > | |
|---|---|
| Evaporation source: | Titanium |
| Electron gun: | 10 kV, 200-500 mA |
| Gas: | Argon gas |
| Film formation pressure: | 0.2 Pa |
| Acceleration voltage (bias voltage): | Ground to −100 V |
| Anode voltage: | 40-50 V |
| Filament voltage: | 7 V |

On the surface of the titanium plating film, a titanium nitride plating film giving a golden color was formed in a thickness of 0.6 μm by ion plating (hot cathode method) under the film formation conditions below.

| < Film Formation Conditions > | |
|---|---|
| Evaporation source: | Titanium |
| Electron gun: | 10 kV, 200-500 mA |
| Gas: | Argon-nitrogen gas mixture |
| Film formation pressure: | 0.2 Pa |
| Acceleration voltage (bias voltage): | Ground to −100 V |
| Anode voltage: | 40-50 V |
| Filament voltage: | 7 V |

On the surfaces of the titanium nitride plating films, a gold-iron alloy plating film giving a golden color was formed in a thickness of 0.1 μm by ion plating (hot cathode method) under the film formation conditions below.

| < Film Formation Conditions > | |
|---|---|
| Evaporation source: | Gold-iron alloy |
| Electron gun: | 8 kV, 500 mA |
| Gas: | Argon gas |
| Film formation pressure: | 0.26 Pa |
| Acceleration voltage (bias voltage): | Ground to −100 V |
| Anode voltage: | 10-30 V |
| Filament voltage: | 7 V |

A part of the gold-iron alloy plating film was treated for masking (with an epoxy resist as the masking material). The gold-iron alloy plating film, the titanium nitride plating film, and the titanium plating film were removed successively by etching solutions. Finally, the mask was removed. Thereby, a watchcase and a watchband were obtained which had an outermost two-tone coating film having a platinum-colored coating film and a gold-colored gold-iron alloy plating film.

The etching solution (peeling liquid) employed for removal of the gold-iron alloy plating film was a solution containing a cyanide compound as the main component and additionally an oxidant. The etching solution for the titanium nitride plating film and for titanium plating film was a solution containing nitric acid as the main component and additionally ammonium fluoride. The mask-peeling liquid employed was methylene chloride.

The platinum coating films formed as above on the surfaces of the watchcase and the watchband had a surface hardness of 1200 (Hv: Vickers hardness micro-tester, load: 5 g, retention time: 10 seconds), and the gold-iron alloy plating film had a surface hardness of 120 (Hv: Vickers hardness micro-tester, load: 5 g, retention time: 10 seconds). The watchcase and watchband had a white coating film formed thereon having high scratch resistance and giving superior quality of a platinum color.

The color evaluations of the ornamental coating layers (white coating films) were $88<L^*<92$, $1.8<a^*<2.5$, and $5.0<b^*<5.5$ according to $L^*a^*b^*$ color space (CIE calorimetric system).

Example C7

On a part of the surfaces of platinum coating films (ornamental coating layer) formed in the same manner as in Example C5, a plating film having a color different from the color of the coating film (differential coloring film) was formed by wet-plating.

Specifically, the base articles having the coating film formed thereon were subjected to pretreatment of electrolytic degreasing, neutralization and water washing for cleaning.

These film-coated base articles were electroplated in a plating solution having the composition below under the electroplating conditions below. Thereby a gold strike-plating film was formed in a thickness of 0.1 μm on the surface of the base articles. The formed plating films were washed with water.

| << Gold Strike Plating >> | |
|---|---|
| < Composition of Plating Solution > | |
| Gold | 3-5 g/L |
| Sulfuric acid | 10 g/L |
| < Plating Conditions > | |
| pH | 0.3 ≦ pH < 1 |
| Solution temperature | 25° C. |
| Current density (Dk) | 3-5 A/dm$^2$ |
| Time | 30 seconds |

These base articles having the gold strike-plating film were electroplated in the plating solution having the composition below under the electroplating conditions below. Thereby a gold-iron alloy plating film was formed in a thickness of 2.0 μm on the gold strike plating film surfaces. The formed films were washed with water.

| << Gold-Iron Alloy Plating >> | |
|---|---|
| < Composition of Plating Solution > | |
| Potassium cyanide | 8.7 g/L (Metal 5.0 g/L) |
| Iron chloride | 2.7 g/L (Metal 1.0 g/L) |
| Citric acid | 150 g/L or more |
| Sodium citrate | 150 g/L or more |
| Brightener | 10 mL/L |
| < Plating Conditions > | |
| pH | 3.5-3.7 |
| Bath temperature | 37-40° C. |
| Current density (Dk) | 1.0-1.5 A/dm$^2$ |
| Be (Baumé specific gravity) | 20 |

The gold-iron alloy plating films were locally treated for masking. The gold-iron alloy plating film, and the gold strike-plating film were removed successively by etching solutions. Finally, the mask was removed. Thereby, a watchcase and a watchband were obtained which had an outermost two-tone coating film having a stainless steel-color hard coating film and a gold-color gold-iron alloy plating film.

The etching solution (peeling liquid) employed for removal of the gold-iron alloy plating film and removal of gold strike plating film was a solution containing a cyanide compound as the main component and additionally an oxidant. The mask-peeling liquid employed was methylene chloride.

The platinum coating films formed as above on the surfaces of the watchcase and the watchband had a surface hardness of 1100 (Hv: Vickers hardness micro-tester, load: 5 g, retention time: 10 seconds), and the gold-iron alloy plating film had a surface hardness of 120 (Hv: Vickers micro-hardness tester, load: 5 g, retention time: 10 seconds). The watchcase and the watchband had a white coating film formed thereon having high scratch resistance and giving superior quality of a platinum color.

The color evaluation values of the ornamental coating layers (white coating films) were 88<L*<92, 1.8<a*<2.5, and 5.0<b*<5.5 according to L*a*b* color space (CIE calorimetric system).

Example C8

On a part of the surfaces of platinum coating films (ornamental coating layer) formed in the same manner as in Example C5, a plating film having a color different from the color of the hard film (differential coloring layer) was formed by dry-plating.

Specifically, a masking material (an epoxy resist) was applied onto a part of the surfaces of the coating films, and was dried. On the coating film surfaces and the mask material surfaces, a titanium plating film was formed in a thickness of 0.05 μm by sputtering (magnetron sputtering system) under the film formation conditions below.

| < Film Formation Conditions > | |
|---|---|
| Target: | Titanium |
| Sputtering gas: | Argon gas |
| Film formation pressure: | 0.02 Pa |
| Power applied to target: | 0.3-0.5 kW |
| Bias voltage (acceleration voltage): | −50 to −100 V |

On the titanium plating film surfaces, a silicon plating film was formed in a thickness of 0.1 μm by sputtering (magnetron sputtering system) under the film formation conditions below.

| < Film Formation Conditions > | |
|---|---|
| Target: | Silicon |
| Sputtering gas: | Argon gas |
| Film formation pressure: | 0.05 Pa |
| Power applied to target: | 0.3-0.5 kW |
| Bias voltage (acceleration voltage): | −50 to −100 V |

Then, on the silicon plating film surfaces, a black diamond-like carbon (DLC) plating film was formed in a thickness of 0.1 μm by plasma CVD (chemical vapor deposition) under the film formation conditions below.

| < Film Formation Conditions > | |
|---|---|
| Gas: | Benzene |
| Film formation pressure: | 0.2 Pa |
| Filament current: | 20 A |
| Anode current: | 2.0 A |
| Cathode voltage (acceleration voltage): | −1.0 to −5.0 kV |

Finally, the masking material was etched by methylene chloride to lift off the titanium plating films, silicon plating films and DCL plating films formed just on the masks. As the result, a watchcase and a watchband were obtained which have respectively an ornamental two-tone coating layer.

The platinum coating films formed as above on the surfaces of the watchcase and watchband had a surface hardness of 1200 (HV: Vickers hardness micro-tester, load: 5 g, retention time: 10 seconds), and the DLC plating films had a surface hardness of 1800 (HV: Vickers hardness micro-tester, load: 5 g, retention time: 10 seconds). The watchcase and the watchband had a white coating film having high scratch resistance and giving superior quality of a platinum color.

The color evaluation values of the ornamental coating layers (white coating films) were 88<L*<92, 1.8<a*<2.5, and 5.0<b*<5.5 according to L*a*b* color space (CIE calorimetric system).

Example C9

A watchcase base article and a watchband base article as personal ornaments having been prepared from titanium by machining were washed and degreased with an organic solvent. Incidentally the surfaces of the base articles had been mirror-finished by machining.

The base articles were set in a sputtering apparatus, and the surfaces of the base articles were cleaned by bombardment in an argon atmosphere.

On the surfaces of the base articles, a zirconium plating film (underlayer) was formed in a thickness of 0.05 µm by sputtering (magnetron sputtering system) under the film formation conditions below.

| < Film Formation Conditions > | |
| --- | --- |
| Target: | Zirconium |
| Sputtering gas: | Argon gas |
| Film formation pressure: | 0.5 Pa |
| Power applied to target: | 0.5 kW |
| Bias voltage (acceleration voltage): | −50 V |

On the respective surfaces of the zirconium plating films formed on the base articles, a white-colored titanium carbide coating film. (titanium carbide layer) was formed in a thickness of 0.6 µm by sputtering (magnetron sputtering system) under the conditions below.

| < Film Formation Conditions > | |
| --- | --- |
| Target: | Titanium |
| Sputtering gas: | Methane-argon gas mixture |
| Film formation pressure: | 0.6 Pa |
| Power applied to target: | 0.5 kW |
| Bias voltage (acceleration voltage): | −50 V |

Then on the respective surfaces of the titanium carbide plating films formed on the base articles, a white-colored stainless steel plating film (stainless steel coating layer) was formed in a thickness of 0.2 µm by sputtering (magnetron sputtering system) under the conditions below.

| < Film Formation Conditions > | |
| --- | --- |
| Target: | Austenitic stainless steel SUS304 |
| Sputtering gas: | Argon gas |
| Film formation pressure: | 0.2-0.9 Pa |
| Power applied to target: | 0.4-0.5 kW |
| Bias voltage (acceleration voltage): | Ground to −300 V |

Finally, on the surfaces of the stainless steel plating films formed on the base articles, a white-colored platinum coating film (ornamental coating layer) was formed in a thickness of 0.05 µm by sputtering (magnetron sputtering system) under the conditions below to obtain a watchcase and a watchband of a platinum color.

| < Film Formation Conditions > | |
| --- | --- |
| Target: | Platinum |
| Sputtering gas: | Argon gas |
| Film formation pressure: | 0.2 Pa |
| Power applied to target: | 0.5 kW |
| Bias voltage (acceleration voltage): | −50 V |

The platinum coating films formed as above on the surfaces of the watchcase and watchband had a surface hardness of 1300 (Hv: Vickers hardness micro-tester, load: 5 g, retention time: 10 seconds) The watchcase and watchband had a white coating film having high scratch resistance and giving superior quality of a platinum color.

The color evaluation values of the ornamental coating layers (white coating films) were 88<L*<92, 1.8<a*<2.5, and 5.0<b*<5.5 according to L*a*b* color space (CIE calorimetric system).

Example C10

A watchcase base article and a watchband base article for personal ornaments having been prepared from stainless steel (SUS316L) by machining were washed and degreased with an organic solvent. Incidentally the surfaces of the base articles had been mirror-finished by machining.

The base articles were set in an ion plating apparatus, and the surfaces of the base articles were cleaned by bombardment in an argon atmosphere.

On the respective surfaces of the base articles, a titanium carbide plating film (underlayer) which has a concentration gradient structure of carbon content of 5-15 atom % was formed in a thickness of 0.05 µm by ion plating (hot cathode method) under the film formation conditions below.

| < Film Formation Conditions > | |
| --- | --- |
| Evaporation source: | Titanium |
| Electron gun: | 10 kV, 200-500 mA |
| Gas: | Argon-methane gas mixture |
| Film formation pressure: | 0.004-0.009 Pa |
| Acceleration voltage (bias voltage): | Ground to −100 V |
| Anode voltage: | 50 V |
| Filament voltage: | 7 V |

On the respective surfaces of the titanium carbide plating films formed as the underlayer on the base article surfaces, a white titanium carbide plating film (titanium carbide layer) containing carbon at a content of 40±10 atom % was formed in a thickness of 0.6 µm by ion plating (hot cathode method) under the film formation conditions below.

| < Film Formation Conditions > | |
| --- | --- |
| Evaporation source: | Titanium |
| Electron gun: | 10 kV, 300 mA |
| Gas: | Methane-argon gas mixture |
| Film formation pressure: | 0.02 Pa |
| Acceleration voltage (bias voltage): | Ground to −100 V |
| Anode voltage: | 60 V |
| Filament voltage: | 7 V |

On the respective plating film surfaces of titanium carbide on the base articles, a white-colored platinum coating film (ornamental coating layer) was formed in a thickness of 0.05 μm by ion plating (hot cathode method) under the conditions below to obtain a watchcase and a watchband of a platinum color tone.

| < Film Formation Conditions > | |
| --- | --- |
| Evaporation source: | Platinum |
| Electron gun: | 10 kV, 500 mA |
| Gas: | Argon gas |
| Film formation pressure: | 0.2 Pa |
| Acceleration voltage (bias voltage): | Ground to −50 V |
| Anode voltage: | 60 V |
| Filament voltage: | 7 V |

The platinum coating films formed as above on the surfaces of the watchcase and the watchband had a surface hardness of 1200 (Hv: Vickers hardness micro-tester, load: 5 g, retention time: 10 seconds). The watch case and watchband had a white coating film formed thereon having high scratch resistance and giving high-quality image similar to stainless steel coating film.

The color evaluation values of the ornamental coating layers (white coating films) were $88<L^*<92$, $1.8<a^*<2.5$, and $5.0<b^*<5.5$ according to $L^*a^*b^*$ color space (CIE calorimetric system).

The watchcase and the watchband obtained above, and the watchcase and the watchband obtained in Example C5 were tested for scratching resistance to compare the adhesion of the film to the base article in the same manner as in Example A9.

An ornament part sample of Example C5 was prepared which had an underlayer constituted of a titanium plating film and a white-colored titanium carbide plating film (abrasion-resistant layer) containing carbon at a content of 40±10 atom %. Separately, another ornament part sample of Example C10 was prepared which had an underlayer constituted of a titanium carbide plating film containing carbon at a content of 5-15 atom % and a white-colored titanium carbide plating film (abrasion-resistant layer) containing carbon at a content of 40±10 atom %. These ornament part samples were measured for adhesion of the coating film (critical load).

The sample of Example C5 caused chipping-peeling at the scratching load of 200 gf, whereas the sample of Example C10 caused the chipping-peeling at the scratching load of 250 gf. That is, the critical load was 200 gf in Example C5, and 250 gf in Example C10. This means that the adhesion of the coating film of the ornament part of Example C10 is higher by 25% than that of Example C5.

In the above Examples C1-C10, naturally, the ornament base article may be made from tungsten carbide; the underlayer may be constituted by a plating film formed from chromium, hafnium, vanadium, or niobium. In Examples C1-C10, watchcases and watchbands were produced. However, the technique of Examples C1-C10 is naturally applicable to other ornament such as necklaces, pendants, and brooches.

The invention claimed is:

1. A personal ornament having as an outermost layer a white ornamental coating film composed of platinum or a platinum alloy formed by dry-plating, comprising
    an ornament base article made of a metal or a ceramic,
    an underlayer formed on the surface on the base article,
    an abrasion resistant layer formed on the surface of the underlayer by dry-plating, and
    an ornamental coating layer composed of platinum or platinum alloy formed on the surface of the abrasion resistant layer by dry-plating,
    wherein the abrasion resistant layer has a thickness of 0.5-1.0 μm, and the ornamental coating layer is a white coating film having a thickness of 0.03-0.06 μm and a surface hardness (Hv; Vickers hardness micro-tester, load: 5 g) of 1000-2000.

2. The ornament according to claim 1, wherein the ornament base article is made of at least one metal selected from the group consisting of stainless steel, titanium, titanium alloys, copper, copper alloys, and tungsten carbide.

3. The ornament according to claim 1, wherein the ornament base article is made of a metal other than copper and copper-alloys, or made of a ceramic, and the underlayer on the surface of the base article is formed by dry-plating from titanium (Ti), chromium (Cr), zirconium (Zr), hafnium (Hf), vanadium (V), niobium (Nb), or tantalum (Ta).

4. The ornament according to claim 1, wherein the ornament base article is made of a metal other than copper and copper-alloys, or made of a ceramic, and the underlayer on the surface of the base article is a metal compound coating film formed by dry-plating from titanium carbide, chromium carbide, zirconium carbide, hafnium carbide, vanadium carbide, niobium carbide, tungsten carbide, or tantalum carbide of a carbon atom content of 5-15 atom %.

5. The ornament according to claim 1, wherein the ornament base article is made of a metal other than copper and copper-alloys, or made of a ceramic, and the underlayer is a coating film of 0.02-0.2 μm thick formed by dry-plating.

6. The personal ornament according to claim 1, wherein the abrasion-resistant layer is a metal compound coating film.

7. The personal ornament according to claim 1, wherein the abrasion-resistant layer is a metal compound coating film containing a titanium carbide layer.

8. The personal ornament according to claim 1, wherein the abrasion-resistant layer is a titanium carbide layer.

9. A personal ornament having as an outermost layer a white ornamental coating film composed of platinum or a platinum alloy formed by dry-plating, comprising
    an ornament base article made of a metal or a ceramic,
    an underlayer formed on the surface on the base article,
    an abrasion resistant layer formed on the surface of the underlayer by dry-plating, and
    an ornamental coating layer composed of platinum or platinum alloy formed on the surface of the abrasion resistant layer by dry-plating,
    wherein the abrasion resistant layer has a thickness of 0.5-1.0 μm, the ornamental coating layer is a white coating film having a thickness of 0.03-0.06 μm, and at least one additional coloring coating film having a monolayer structure, a two-layer structure or a three-layer structure and having a color different from the color of the ornamental coating layer is formed on a part of the surface of the ornamental coating layer by dry-plating or wet-plating.

10. The ornament according to claim 9, wherein at least one of the additional coloring coating film(s) is composed of gold, a gold alloy, titanium nitride, zirconium nitride, hafnium nitride, or diamond-like carbon (DLC).

11. The ornament according to claim 9, wherein the two-layer structure of at least one of the additional coloring coating film(s) is constituted of a lower layer composed of titanium nitride, zirconium nitride, or hafnium nitride and an upper layer composed of gold or a gold alloy.

12. The ornament according to claim 10, wherein the three-layer structure of at least one of the additional coloring coating film(s) is constituted of a lower layer composed of a titanium coating film, an intermediate layer of a silicon coating film and an upper layer of a diamond-like carbon (DLC) coating film.

13. A personal ornament having
a coloring layer comprising an abrasion-resistant layer, a mixture layer and an outermost layer in this order, said outermost layer being a white hard coating film composed of a noble metal or a noble metal alloy, and being formed by dry-plating on the surface of said mixture,
wherein said noble metal or a noble metal alloy of the outermost layer of coloring layer is selected from the group consisting of platinum (Pt), palladium (Pd), rhodium (Rh), and alloys thereof, the thickness of the outermost layer is 0.005 to 0.01 μm and wherein the coloring layer has a surface hardness (HV; Vickers hardness tester, load: 5 g, retention time: 10 seconds) of 700-2000.

14. A personal ornament having as an outermost layer a white ornamental coating film composed of platinum or a platinum alloy formed by dry-plating, comprising
an ornament base article made of a metal or a ceramic,
an underlayer formed on the surface of the base article,
an abrasion resistant layer formed on the surface of the underlayer by dry-plating,
a mixture layer formed on the surface of the abrasion resistant layer by dry-plating, and
an ornamental coating layer as an outermost layer being a white hard coating film composed of platinum or platinum alloy formed on the surface of the mixture layer by dry-plating,
wherein the abrasion resistant layer has a thickness of 0.5-1.0 μm, the ornamental coating layer has a thickness of 0.03-0.06 μm, and wherein a surface layer comprising the abrasion resistant layer, the mixture layer and the ornamental coating layer has a surface hardness (Hv; Vickers hardness micro-tester, load: 5 g) of 1000-2000.

15. The ornament according to claim 14, wherein, at least one additional coloring coating film having a monolayer structure, a two-layer structure or a three-layer structure and having a color different from the color of the ornamental coating layer and is formed on a part of the surface of the ornamental coating layer by dry-plating or wet-plating.

16. The ornament according to claim 15, wherein at least one of the additional coloring coating film(s) is composed of gold, a gold alloy, titanium nitride, zirconium nitride, hafnium nitride, or diamond-like carbon (DLC).

17. The ornament according to claim 15, wherein the two-layer structure of at least one of the additional coloring coating film(s) is constituted of a lower layer composed of titanium nitride, zirconium nitride, or hafnium nitride and an upper layer composed of gold or a gold alloy.

18. The ornament according to claim 15, wherein the three-layer structure of at least one of the additional coloring coating film(s) is constituted of a lower layer composed of a titanium coating film, an intermediate layer of a silicon coating film and an upper layer of a diamond-like carbon (DLC) coating film.

19. A personal ornament having as an outermost layer a white ornamental coating film composed of platinum or a platinum alloy formed by dry-plating, comprising
(a) an ornament base article made of a metal or a ceramic,
(b) an underlayer formed on the surface of the base article, wherein the underlayer is constituted of:
(1) a nickel coating film of 1-10 μm thick formed on the surface of the ornament base article made of copper or a copper alloy by wet-plating, and
(2) an amorphous nickel-phosphorus alloy coating film of 3-10 μm thick formed on the surface of the nickel coating film by wet-plating,
(c) an abrasion resistant layer formed on the surface of the underlayer by dry-plating,
(d) a mixture layer formed on the surface of the abrasion resistant layer by dry-plating, and
(e) an ornamental coating layer as an outermost layer being a white hard coating film composed of platinum or platinum alloy formed on the surface of the mixture layer by dry-plating, wherein the abrasion resistant layer has a thickness of 0.5-1.0 μm, and the ornamental coating layer has a thickness of 0.03-0.06 μm.

20. A personal ornament having as an outermost layer a white ornamental coating film composed of platinum or a platinum alloy formed by dry-plating, comprising
an ornament base article made of a metal or a ceramic,
an underlayer formed on the surface of the base article,
an abrasion resistant layer formed on the surface of the underlayer by dry-plating,
a stainless steel coating layer formed on the surface of the abrasion resistant layer by dry-plating, and
an ornamental coating layer as an outermost layer being a white hard coating film composed of platinum or platinum alloy formed on the surface of the stainless steel coating layer by dry-plating,
wherein the abrasion resistant layer has a thickness of 0.5-1.0 μm, and the ornamental coating layer has a thickness of 0.03-0.06 μm, and wherein the stainless steel coating layer is composed of an austenitic stainless steel having a composition of 0.01-0.12 vol % carbon, 0.1-1.5 vol % silicon, 1.0-2.5 vol % manganese, 8-22 vol % nickel, 15-26 vol % chromium, and balance of iron.

21. A personal ornament having as an outermost layer a white ornamental coating film composed of platinum or a platinum alloy formed by dry-plating, comprising
an ornament base article made of a metal or a ceramic,
an underlayer formed on the surface of the base article,
an abrasion resistant layer formed on the surface of the underlayer by dry-plating,
a stainless steel coating layer formed on the surface of the abrasion resistant layer by dry-plating, and
an ornamental coating layer as an outermost layer being a white hard coating film composed of platinum or platinum alloy formed on the surface of the stainless steel coating layer by dry-plating,
wherein the abrasion resistant layer has a thickness of 0.5-1.0 μm, and the ornamental coating layer has a thickness of 0.03-0.06 μm, and wherein at least one additional coloring coating film having a monolayer structure, a two-layer structure or a three-layer structure and having a color different from the color of the ornamental coating layer and is formed on a part of the surface of the ornamental coating layer by dry-plating or wet-plating.

22. The ornament according to claim 21, wherein at least one of the additional coloring coating film(s) is composed of gold, a gold alloy, titanium nitride, zirconium nitride, hafnium nitride, or diamond-like carbon (DLC).

23. The ornament according to claim 21, wherein the two-layer structure of at least one of the additional coloring coating film(s) is constituted of a lower layer composed of titanium nitride, zirconium nitride, or hafnium nitride and an upper layer composed of gold or a gold alloy.

24. The ornament according to claim 21, wherein the three-layer structure of at least one of the additional coloring coating film(s) is constituted of a lower layer composed of a titanium coating film, an intermediate layer of a silicon coating film and an upper layer of a diamond-like carbon (DLC) coating film.

25. A personal ornament having as an outermost layer a white ornamental coating film composed of platinum or a platinum alloy formed by dry-plating, comprising an ornament base article made of a metal or a ceramic, an underlayer formed on the surface of the base article, an abrasion resistant layer formed on the surface of the underlayer by dry-plating, a stainless steel coating layer formed on the surface of the abrasion resistant layer by dry-plating, and an ornamental coating layer as an outermost layer being a white hard coating film composed of platinum or platinum alloy formed on the surface of the stainless steel coating layer by dry-plating, wherein the abrasion resistant layer has a thickness of 0.5-1.0 µm, and the ornamental coating layer has a thickness of 0.03-0.06 µm, and wherein a surface layer comprising the abrasion resistant layer, stainless steel layer and the ornamental coating layer has a surface hardness (Hv; Vickers hardness micro-tester, load: 5 g) of 1000-2000.

* * * * *

UNITED STATES PATENT AND TRADEMARK OFFICE
CERTIFICATE OF CORRECTION

PATENT NO. : 7,622,198 B2 Page 1 of 1
APPLICATION NO. : 10/469394
DATED : November 24, 2009
INVENTOR(S) : Miya et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 527 days.

Signed and Sealed this

Twenty-sixth Day of October, 2010

David J. Kappos
*Director of the United States Patent and Trademark Office*